(12) United States Patent
Nickel

(10) Patent No.: US 7,186,992 B2
(45) Date of Patent: Mar. 6, 2007

(54) METHOD OF FABRICATING A POLARIZING LAYER ON AN INTERFACE

(75) Inventor: Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 257 days.

(21) Appl. No.: 11/053,381

(22) Filed: Feb. 7, 2005

(65) Prior Publication Data

US 2006/0177594 A1    Aug. 10, 2006

(51) Int. Cl.
C23C 14/00   (2006.01)
C23C 16/00   (2006.01)
B05C 11/00   (2006.01)

(52) U.S. Cl. .............. 250/492.21; 427/523; 427/566; 427/569

(58) Field of Classification Search .................. None
See application file for complete search history.

(56) References Cited

U.S. PATENT DOCUMENTS

| | | | |
|---|---|---|---|
| 5,042,887 A | 8/1991 | Yamada | |
| 5,082,359 A | 1/1992 | Kirkpatrick | |
| 5,855,967 A | 1/1999 | Kirkpatrick | |
| 6,251,835 B1 | 6/2001 | Chu et al. | |
| 6,331,227 B1 | 12/2001 | Dykstra et al. | |
| 6,375,790 B1 | 4/2002 | Fenner | |
| 6,416,820 B1 | 7/2002 | Yamada | |
| 6,486,478 B1 | 11/2002 | Libby et al. | |
| 6,491,800 B2 | 12/2002 | Kirkpatrick et al. | |
| 6,498,107 B1 | 12/2002 | Fenner | |
| 6,537,606 B2 | 3/2003 | Allen et al. | |
| 6,595,506 B1 | 7/2003 | Zide et al. | |
| 6,613,240 B2 | 9/2003 | Skinner et al. | |
| 6,624,081 B2 | 9/2003 | Dykstra et al. | |
| 6,629,508 B2 | 10/2003 | Dykstra | |
| 6,635,883 B2 | 10/2003 | Torti et al. | |
| 6,646,277 B2 | 11/2003 | Mack et al. | |
| 6,660,340 B1 | 12/2003 | Kirkpatrick | |
| 6,676,989 B2 | 1/2004 | Kirkpatrick et al. | |
| 6,737,643 B2 | 5/2004 | Torti et al. | |
| 6,750,460 B2 | 6/2004 | Greer | |
| 6,770,874 B2 | 8/2004 | Dykstra | |
| 2004/0037970 A1* | 2/2004 | Akizuki et al. ............. | 427/566 |
| 2006/0172086 A1* | 8/2006 | Nickel ........................ | 427/569 |

OTHER PUBLICATIONS htt;://www.epion.com/technology_body.html; Epion 15 Pages; Technology-GCIB Overview.

(Continued)

*Primary Examiner*—David Vanore

(57) ABSTRACT

A method of fabricating a polarizing layer using a gas cluster ion beam apparatus (GCIB) is disclosed. The method includes generating a metal-organic gas that includes a metal-organic compound. The metal-organic compound includes a polarizing material, such as iron Fe, Co, or CoFe, for example. The metal-organic gas and a carrier gas are combined to form a composite gas that is supplied to the GCIB. The GCIB processes the composite gas to form a beam of gas cluster ions that include the polarizing material. The beam irradiates an interface surface of a layer of material and at least a portion of the polarizing material remains in contact with the interface surface to form the polarizing layer on the interface surface.

35 Claims, 14 Drawing Sheets

OTHER PUBLICATIONS

Electronic Engineering Time; Jun. 14, 2004; Infusion Doping Gets the Call in Battle to Stop Leakage; by Mark Lapedus. http://Solidstate.Articles.Printthis.Clickability.com/PT/CPT?Action=CPT&Title=USJ+and+Strain..; Solidstate Technoogy; USJ and Strained-SI Formation Using Infusion Doping and Slides From Epion ; 64 Pages; Re: GCIB Application.

Pending U.S. Appl. No. 10/977,382, filed Oct. 29, 2004; inventor: Janice H Nickel.

* cited by examiner

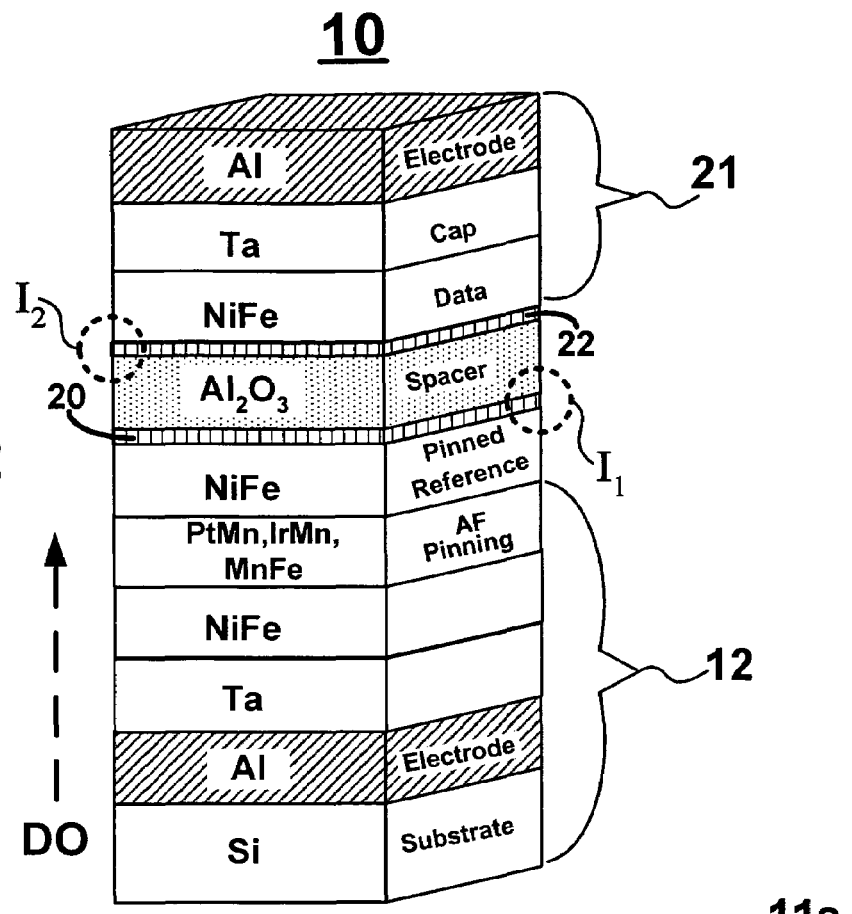
FIG. 2
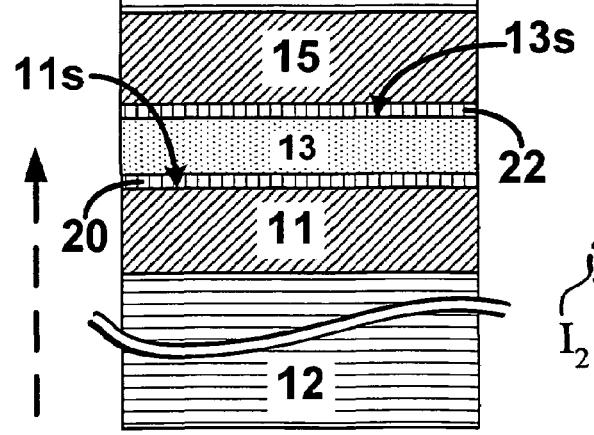
FIG. 3a
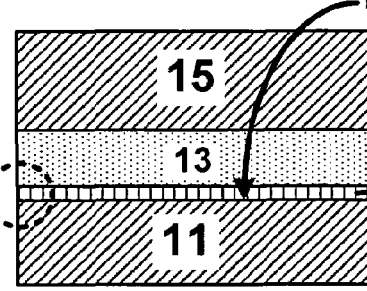
FIG. 3b
FIG. 3c

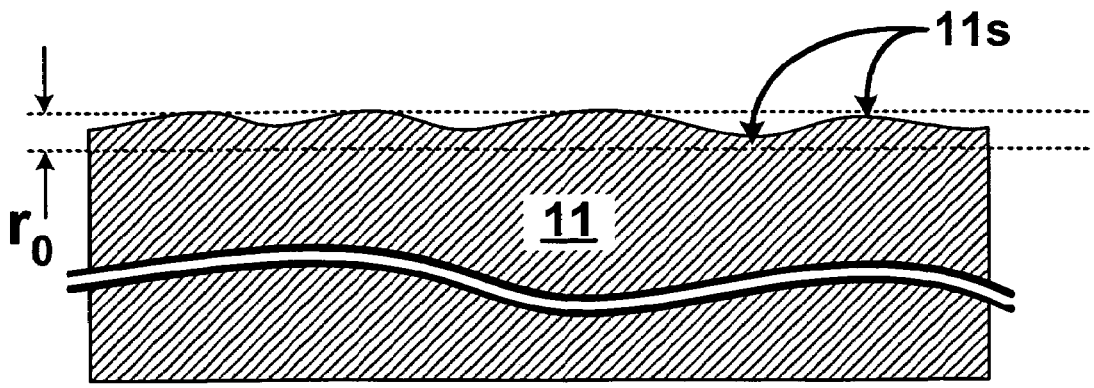
FIG. 4a
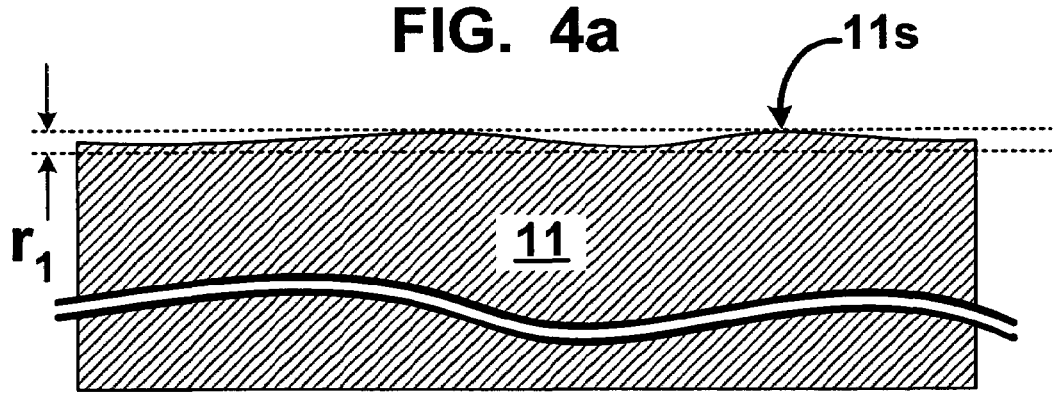
$r_1 \ll r_0$   FIG. 4b
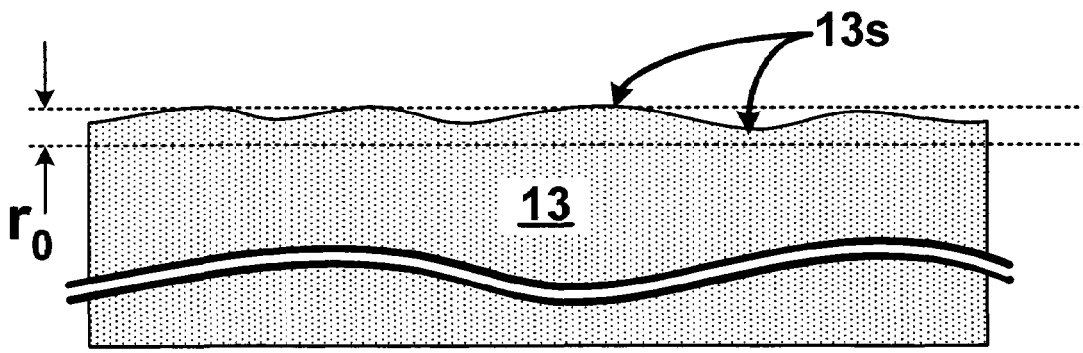
FIG. 4c
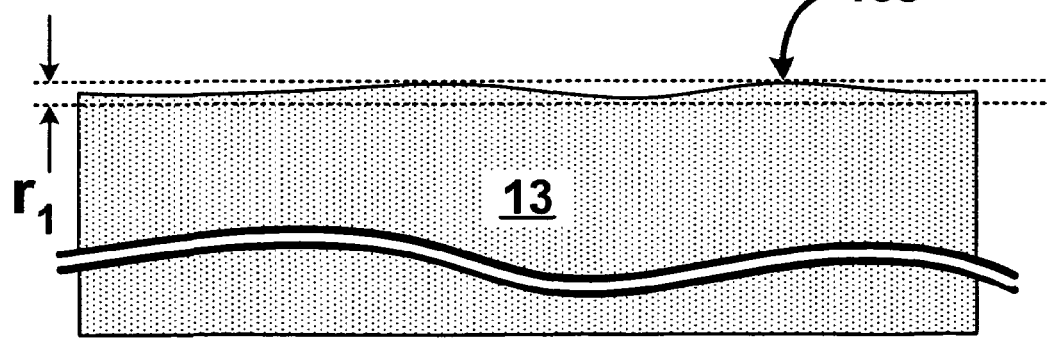
$r_1 \ll r_0$   FIG. 4d t >> d   FIG. 13b

METHOD OF FABRICATING A POLARIZING LAYER ON AN INTERFACE

FIELD OF THE INVENTION

The present invention relates generally to a method of fabricating a polarizing layer on an interface surface. More specifically, the present invention relates to a method of fabricating a polarizing layer on an interface surface of a magnetoresistance device using a gas cluster ion beam apparatus and a metal-organic gas generator.

BACKGROUND ART

A magnetoresistance device is a type of memory device in which data can be stored as an alterable orientation of magnetization. As one example, a tunneling magnetoresistance (TMR) device can include a reference layer (also referred to as a pinning film or pinned layer) that includes a pinned orientation of magnetization that is fixed in a predetermined orientation, a data layer that includes an alterable orientation of magnetization that can be altered by an external magnetic field, and a thin tunnel barrier layer that separates the data layer from the reference layer.

A state of the data stored in the data layer is determined by an orientation of the alterable orientation of magnetization relative to the pinned orientation of magnetization. For example, if the alterable orientation of magnetization is oriented in the same direction as the pinned orientation of magnetization (e.g. parallel), then a logic "1" is stored in the data layer. On the other hand, if the alterable orientation of magnetization is oriented in an opposite direction as the pinned orientation of magnetization (e.g. anti-parallel), then a logic "0" is stored in the data layer.

For a TMR device, the state of the data stored in the data layer is determined by measuring or sensing a tunneling resistance across the data and reference layers. One value of resistance is indicative of the logic "1" and a different value of resistance is indicative of the logic "0". It is desirable to have the value of resistance for the logic "1" be as far apart as possible from the value of resistance for the logic "0". The further apart those two values are, the higher a signal-to-noise ratio $\Delta R/R$ of the TMR device. The $\Delta R$ is a change in resistance from a logic "1" or a logic "0" or vice-versa and R is a lower of the resistance values for a logic "1" to a logic "0". A high signal-to-noise ratio allows for accurate sensing of the data in the data layer during a read operation to the TMR device. Accurate sensing is a necessity if the TMR device is to be used for data storage (e.g. as a MRAM device). A low signal-to-noise ratio is undesirable because the value of resistance for the logic "0" is not different enough from the value of resistance for the logic "1"; therefore, the state of the data cannot be accurately determined and the TMR device will not be suitable as a memory device for data storage.

The signal-to-noise ratio $\Delta R/R$ can be increased by depositing a thin layer of a polarizing material, such as iron (Fe), cobalt (Co), or cobalt and iron (CoFe), at an interface between the tunnel barrier layer and the data and references layers. The layer of the polarizing material must be very thin (e.g. only a few monolayers thick) and must uniformly cover the surface it is deposited on. Prior deposition processes include standard sputtering, atomic layer deposition (ALD), and molecular beam epitaxy (MBE).

Disadvantages to prior sputtering deposition systems include a non-uniform coverage of the polarizing material on the surface it is deposited on. Metals (e.g. Fe, Co, or CoFe) tend to form island growth, and then coalesce into a continuous and non-uniform film. Additionally, depositing a uniform layer with a thickness of a few monolayers is not possible using the prior sputtering deposition systems. In some applications (e.g. MRAM) it is desirable to limit the thickness of the polarizing material, since highly polarized materials tend to have a high saturation magnetization (Ms). A high Ms can contribute to a high ferromagnetic Ne'el coupling, a high antiferromagnetic demagnetization coupling in the antiferromagnetic layer, and a high coercivity in the ferromagnetic data layer. Accordingly, a method of depositing a few monolayers (e.g about 5.0 monolayers or less) of the highly polarized material is desired.

ALD is another prior method for depositing layers of material that are only a few monolayer thick. ALD can create uniform layers with very controllable thickness; however, the deposited layer is conformal to the underlying topography of the underlying surface. Therefore, a surface roughness or defects in the topography can result in a non-uniform layer of the polarizing material. Another disadvantage of ALD is that it is a reactive deposition method, not a direct deposition method. For some materials, ALD requires a water ($H_2O$) precursor, which is destructive to the ferromagnetic materials in a TMR device (i.e. the water causes corrosion).

Finally, MBE is capable of true atomic layer growth of layers that are a few monolayers thick; however, MBE is a prohibitively expensive process that is not economically viable for the mass production of semiconductor devices. Moreover, a range of materials that are compatible with the MBE process is limited.

Consequently, there exists a need for a method of fabricating a thin and uniform polarizing layer on an interface surface. There is also a need for a method of fabricating a polarizing layer on an interface surface that also reduces a surface roughness of the interface surface.

SUMMARY OF THE INVENTION

The present invention solves the aforementioned problems by combining a gas cluster ion beam apparatus (GCIB) with a source for generating a metal-organic gas. The metal-organic gas includes a metal-organic compound that includes a polarizing material. The metal-organic gas is combined with a carrier gas to form a composite gas that includes the metal-organic compound. The composite gas is processed by the GCIB (e.g. is clustered, ionized, and accelerated) and a beam of gas cluster ions that include the metal-organic compound is targeted at an interface surface. The interface surface is irradiated by the beam of gas cluster ions and the resulting impact of the gas cluster ions with the interface surface deposits the polarizing material on the interface surface to form a polarizing layer on the interface surface.

A method of fabricating a polarizing layer using the GCIB includes generating a metal-organic gas that includes at least one metal-organic compound. The metal-organic compound includes a polarizing material (e.g. Fe, Co or CoFe). A composite gas is formed by combing the metal-organic gas with a carrier gas. The GCIB processes the composite gas to form a beam of gas cluster ions. The gas cluster ions include the polarizing material contained in the metal-organic compound. An interface surface is irradiated with the beam of gas cluster ions to form a first polarizing layer on the interface surface. Optionally, another interface surface can be irradiated with the beam of gas cluster ions to form a second polarizing layer on the interface surface. The irradiation by the GCIB forms a thin and uniform polarizing layer of the polarizing material on the interface surface. Moreover, the GCIB can be used to smooth the interface surface prior to the irradiating or during the irradiating.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 2 is a profile view depicting an example of magnetoresistance memory device including a first polarizing layer and a second polarizing layer.

FIG. 3a is a cross-sectional view depicting a first polarizing layer deposited on an interface surface and a second polarizing layer deposited on an interface surface.

FIGS. 3b and 3c are cross-sectional views depicting a first polarizing layer deposited on an interface surface of a precursor layer and a tunnel barrier layer respectively.

FIGS. 4a and 4b are cross-sectional views depicting an interface surface of a precursor layer before and after a smoothing process respectively.

FIGS. 4c and 4d are cross-sectional views depicting an interface surface of a tunnel barrier layer before and after a smoothing process respectively.

FIG. 12b is an enlarged cross-sectional view of a section I—I of FIG. 12a.

FIG. 13b is an enlarged cross-sectional view of a section I—I of FIG. 13a.

DETAILED DESCRIPTION

Figure 1:
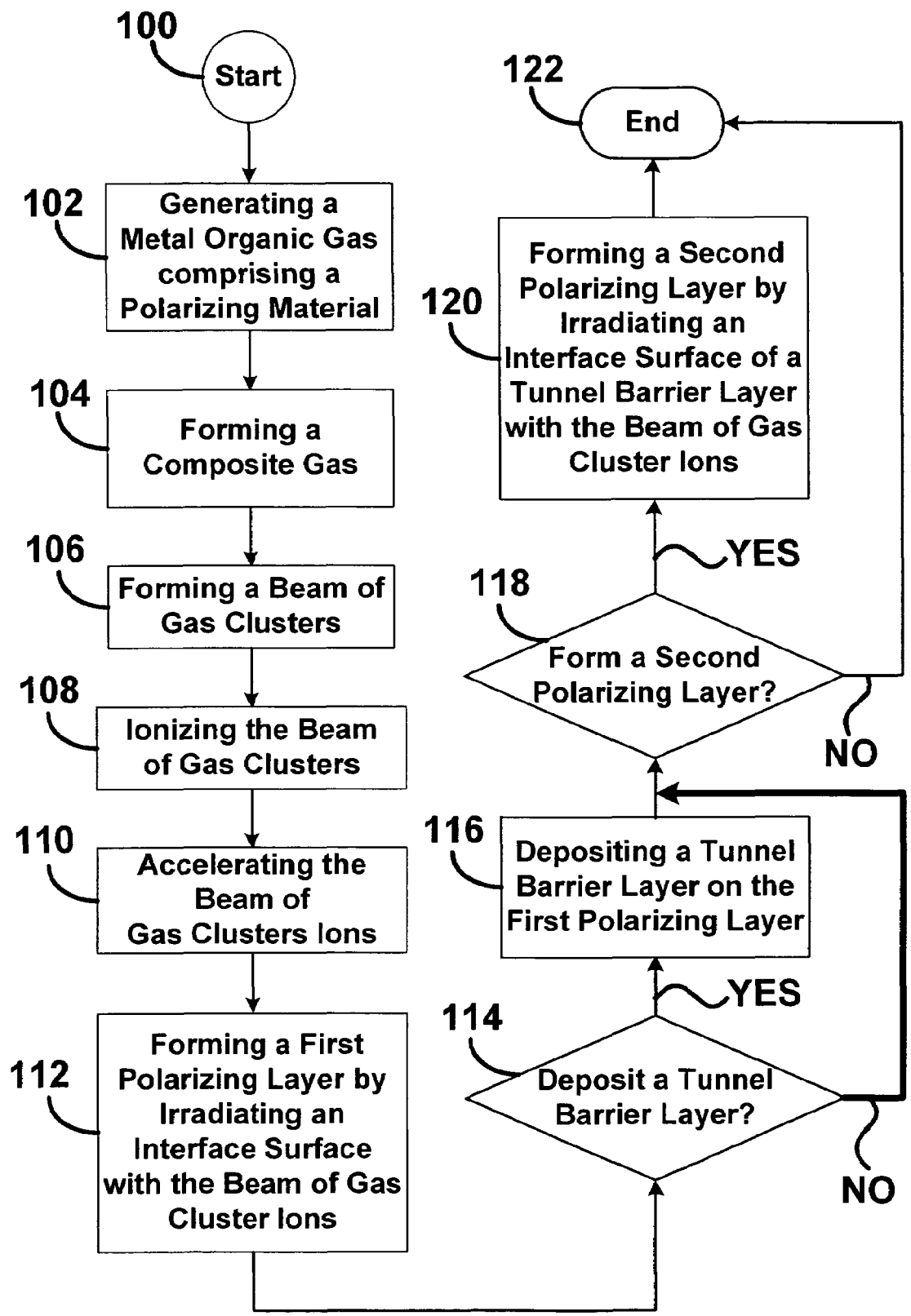
FIG. 1 is a flow diagram depicting method of fabricating a polarizing layer using a gas cluster ion beam apparatus and a source for generating a metal-organic gas.

In the following detailed description and in the several figures of the drawings, like elements are identified with like reference numerals.

As shown in the drawings for purpose of illustration, the present invention is embodied in a method of fabricating a polarizing layer using a gas cluster ion beam apparatus (GCIB). The method includes generating a metal-organic gas that includes at least one metal-organic compound. The metal-organic compound includes a polarizing material (e.g. Fe, Co, or CoFe). A composite gas is formed by combining the metal-organic gas with a carrier gas. The GCIB processes the composite gas to form a beam of gas cluster ions. The gas cluster ions include the polarizing material contained in the metal-organic compound. An interface surface is irradiated with the beam of gas cluster ions to form a first polarizing layer on the interface surface. Optionally, another interface surface can be irradiated with the beam of gas cluster ions to form a second polarizing layer on the interface surface.

In FIG. 1, a method 100 of fabricating a polarizing layer using a gas cluster ion beam apparatus includes at a stage 102, generating a metal-organic gas that includes at least one metal-organic compound. Processes for generating the metal-organic gas are well understood in the microelectronics art and include but are not limited to using a metal-organic chemical vapor deposition (MOCVD) process to generate the metal-organic gas. The metal-organic compound includes a polarizing material, such as the elements iron (Fe), cobalt (Co), or cobalt and iron (CoFe), for example.

Figure 5:
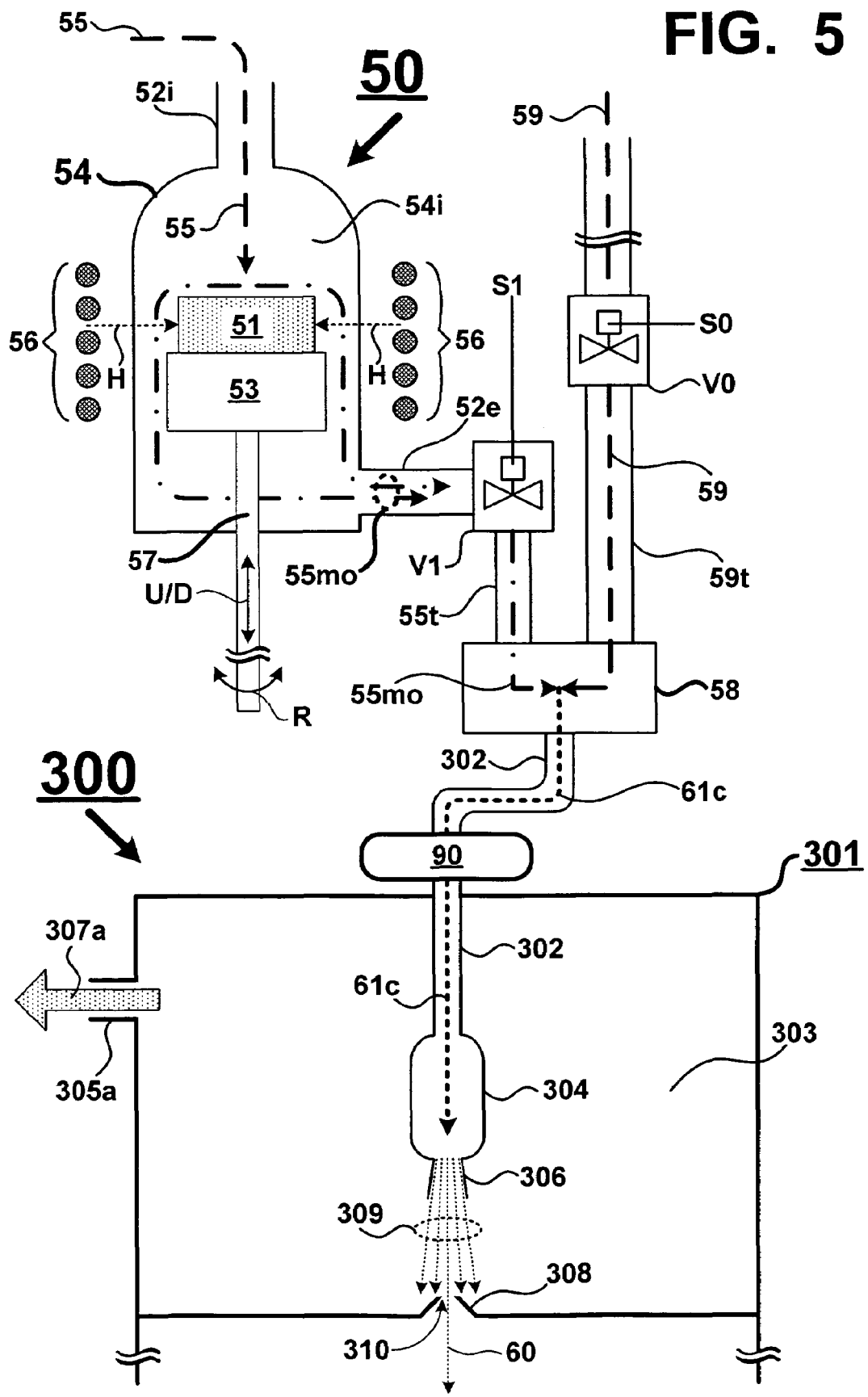
FIG. 5 is a cross-sectional view depicting an example of a generator for generating a metal-organic gas that is combined with a carrier gas to form a composite gas that is supplied to a gas cluster ion beam apparatus.

Turning to FIG. 5, as one example of how the metal-organic gas can be generated at the stage 102, a metal-organic generator 50 includes a reactor vessel 54 that includes a metal-organic source material 51 connected with a substrate 53 and positioned in an interior 54i of the reactor vessel 54. For example, the substrate 53 can be a platen upon which the metal-organic source material 51 is mounted. The metal-organic source material 51 includes at least one metal-organic compound that includes the polarizing material. The aforementioned iron (Fe), cobalt (Co), or cobalt and iron (CoFe) are exemplary polarizing materials because they are effective as a highly polarized material at an interface between a ferromagnetic layer (e.g. a data layer or a reference layer) and a tunnel barrier layer in a magnetoresistance device.

A high polarization material is characterized by having a larger density of states in one spin direction as opposed to another spin direction at the Fermi level. Some elements that don't have a high polarization in bulk may have a high polarization when formed in a thin film (e.g. about 1.0 nm or less in thickness). The elements (Fe), (Co), or cobalt-iron (CoFe) are examples of a high polarization material; however, there are other high polarization materials that are suitable as a metal-organic precursor for the metal-organic source material 51. Accordingly, the present invention is not to be construed as being limited to the elements (Fe), (Co), or (CoFe) for the polarizing material. Those skilled in the microelectronics art will appreciate that the metal-organic source material 51 may include other elements and trace elements in addition to the polarizing material.

A gas inlet 52$i$ is connected to a gas source (not shown) so that a gas 55 is communicated into the interior 54$i$. A heat source 56 is positioned in thermal communication with the reactor vessel 54 so that heat H generated by the heat source 56 heats up the metal-organic source material 51 as the gas 55 flows over the metal-organic source material 51. The heating H results in a dissociating of the metal-organic compounds carried by the metal-organic source material 51 into the gas 55. The dissociated metal-organic compounds are carried away by the gas 55 to form a metal-organic gas 55$mo$. Consequently, the polarizing material (e.g. Fe, Co, or CoFe) will be incorporated into the metal-organic gas 55$mo$.

Those skilled in the microelectronics art will also appreciate that the heating H of the metal-organic source material 51 can be accomplished using a variety of methods including but not limited to the use of radio frequency coils (RF coils) as the heat source 56. The RF coils can be electrically connected with a RF power supply (not shown). During the heating H, a shaft 57 connected with the substrate 53 may optionally be used to rotate R and/or translate U/D (e.g. up or down) the substrate 53 to effectuate the dissociation of the metal-organic compound into the gas 55 and to properly position the metal-organic source material 51 in a heat zone generated by the heat source 56. The metal-organic gas 55$mo$ can exit the reactor vessel 54 through an exhaust port 52$e$. The metal-organic generator 50 can be like those used in a MOCVD apparatus, for example. However, other means can be used to generate the metal-organic gas 55$mo$ and the present invention is not be construed as being limited to the examples set forth herein.

Returning to FIG. 1, at a stage 104, a composite gas 61$c$ is formed by combining the metal-organic gas 55$mo$ with a carrier gas 59. Typically, the carrier gas 59 is a condensible gas suitable for use in a gas cluster ion beam apparatus 300 (GCIB 300 hereinafter) to form a plurality of gas clusters. The gas clusters formed in the GCIB 300 will include atoms and/or molecules of the polarizing material. For example, the gas clusters can include atoms and/or molecules of the iron (Fe), the cobalt (Co), or the cobalt and iron (CoFe). The carrier gas 59 is combined (e.g. is mixed) with the metal-organic gas 55$mo$ to form the composite gas 61$c$ so that the metal-organic compounds carried by the metal-organic gas 55$mo$ are included the gas clusters generated by the GCIB 300. The carrier gas 59 and the gas 55 may be identical gasses or they can be different gasses. Moreover, the carrier gas 59 and the gas 55 may be supplied from the same gas source or they may be supplied from different gas sources. The carrier gas 59 can be a gas including but not limited to an inert gas, nitrogen (N), oxides of nitrogen, oxygen ($O_2$), carbon dioxide ($CO_2$), carbon monoxide (CO), xenon (Xe), hydrogen (H), fluorine (F), methane ($CH_4$), silane ($SiH_4$), sulfur hexafluoride ($SF_6$), and a fluorocarbon.

As one example of how the metal-organic gas 55$mo$ can be combined with the carrier gas 59, in FIG. 5, the metal-organic gas 55$mo$ and the carrier gas 59 are combined in a manifold 58 via tubes (55$t$, 59$t$) where the gasses mix together to form the composite gas 61$c$. Optionally, a series of valves V0 and V1 can be used to control the flow of the gasses (55$mo$, 59). The valves (V0, V1) can be manually actuated by a user, mechanically actuated, or electrically actuated by a computer or a dedicated process controller, for example. For instances, the valves (V0, V1) can be electrically actuated via electrical signals (S0, S1) in electrical communication with a computer running a software program that controls the metal-organic generator 50 and/or the GCIB 300.

As will be described below, the GCIB 300 can also be used for surface smoothing by bombarding an interface surface with gas cluster ions. To that end, the valve V1 can be closed and the valve V0 can remain open so that gas cluster ions formed by the carrier gas can be used for a surface smoothing process. On the other hand, if the composite gas 61$c$ is suitable for surface smoothing, then both valves (V0, V1) can remain open for the surface smoothing process.

Referring again to FIG. 1, at a stage 106, a beam 60 comprising a plurality of gas cluster is formed from the composite gas 61$c$. The beam 60 includes the metal-organic compounds carried by the composite gas 61$c$ (i.e. the polarizing material). Turning to FIG. 5, as is well understood in the GCIB art, the GCIB 300 includes a gas source chamber 301 that includes a gas feed tube 302 connected with a stagnation chamber 304. The composite gas 61$c$ enters the stagnation chamber 304 at a high pressure where it condenses and then adiabatically expands through an expansion nozzle 306 to form a plurality of gas clusters 309. The gas clusters 309 can include several to several thousand (e.g. >5000) weakly bound atoms and/or molecules. Some of those atoms and/or molecules will comprise the polarizing material (e.g. Fe, Co, or CoFe). A majority of the gas clusters 309 are skimmed away by a skimmer 308 that includes a very small aperture 310. However, a core of the gas clusters 309 pass through the aperture 310 to form the beam 60. An interior 303 of the gas source chamber 301 should be maintained at level of vacuum (e.g. <$10^{-3}$ torr) necessary for the generation of the beam 60. Accordingly, the gas source chamber 301 typically includes a fitting 305$a$ connected with a vacuum source 307$a$ (not shown) that maintains a precise vacuum in the interior 303.

The configuration depicted in FIG. 5 is only one example of how the metal-organic gas 55$mo$ can be generated. Those skilled in the microelectronics art will appreciate that if the gas 55 and the carrier gas 59 are identical, then the manifold 58, the valve V0, and the tube 59$t$ may be eliminated and the tube 55$t$ can be connected with the gas feed tube 302. Consequently, the gas 55 serves as the carrier gas for the GCIB 300 and the composite gas 61$c$ comprises the metal-organic compounds that are dissociated from the metal-organic source material 51 and into the gas 55 to form the metal-organic gas 55$mo$. Therefore, if the gas 55 is used as the carrier gas, then the gas 55 should be a compressible gas that is suitable for forming the gas clusters 309.

For some applications, it may be necessary to purify the metal-organic gas 55$mo$ to remove one or more elements from the gas so that they are reduced in concentration or are not included in the composite gas 61$c$. To that end, a filter 90 can be used to remove or reduce the number of undesirable elements contained in the metal-organic gas 55$mo$. For example, the filter 90 can be a mass analyzer (e.g. such as the type used in mass spectrometry) that sorts species of elements based on a mass-to-charge ratio. Although depicted with a position that is in line with the gas feed tube 302, the filter 90 may also be placed in line with the exhaust port 52$e$ or the tube 55$t$.

Figure 6:
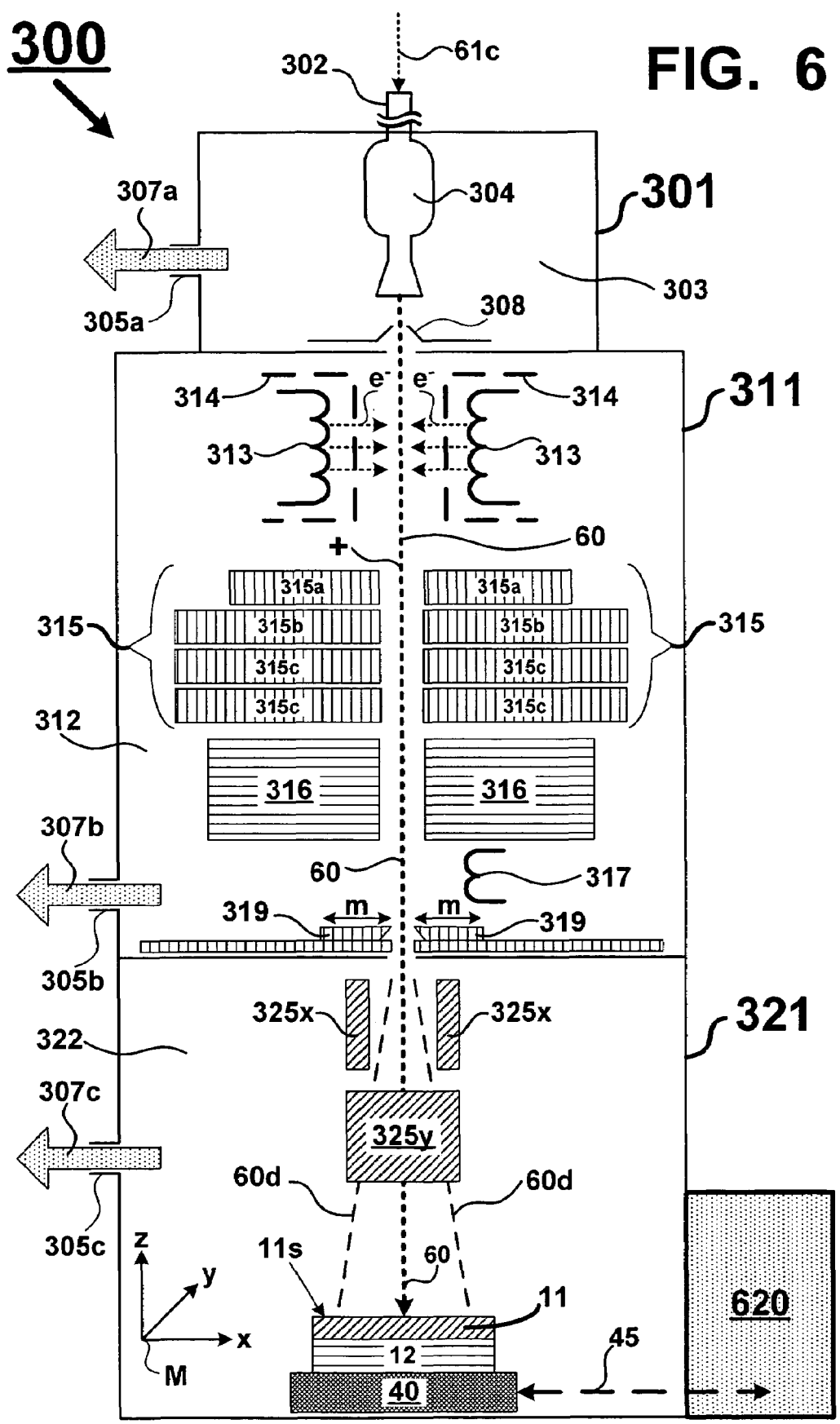
FIG. 6 is cross-sectional view depicting a gas cluster ion beam apparatus and an interface surface that is irradiated by a beam of gas cluster ions that include a polarizing material.

Turning to FIG. 6 and referring to a stage 108 in FIG. 1, the beam 60 is ionized to impart a net charge (i.e. a positive "+" or a negative "−" charge) on each gas cluster 309 in the beam 60. As an example, the GCIB 300 can include an ionization chamber 311 that includes an ionization filament 313 for generating a stream of thermoelectrons e− that bombard the beam 60 resulting in electrons being ejected from the gas clusters 309 so that a net positive charge "+" is imparted to the gas clusters 309. An anode 314 is positioned adjacent to the filaments 313 and extracts the thermoelectrons e− from the filaments 313. The ionization filaments 313 and the anodes 314 can be connected with appropriate power supplies (not shown) to heat the ionization filaments 313 and to bias the anodes 314. A fitting 305b can be connected to a vacuum source 307b (not shown) that maintains a precise vacuum in an interior 312 of the ionization chamber 311.

At a stage 110, the beam 60 is accelerated to increase a momentum of the gas clusters ions 309. The GCIB 300 can include an acceleration section 315 that includes a plurality of high voltage electrodes that are connected with high voltage power supplies (not shown) and operative to accelerate and focus the beam 60. For example, the acceleration section 315 can include an extraction electrode 315a for extracting ions from the ionization region of the ionization filaments 313, an accelerator electrode 315b for accelerating the beam 60 to an energy level in the keV range, and one or more lens electrodes 315c for electrostatically focusing the beam 60 so the beam 60 is collimated and follows a predictable trajectory through the GCIB 300 towards an interface surface of a layer of material as will be described below.

The aforementioned stages 104, 106, 108, and 110 comprise a processing of the composite gas 61c by the GCIB 300 to form the beam 60 of gas cluster ions 309 that include the polarizing material. As will be described below, the beam 60 will be used to irradiate an interface surface to form a first polarizing layer, and optionally, a second polarizing layer.

Furthermore, the GCIB 300 may optionally include: a magnetic filter 316 for deflecting light monomer ions and dimers out of the beam 60 while not deflecting the heavier gas cluster ions 309 that include the metal-organic compounds; a neutralizing filament 317 to inject low energy electrons into the beam 60 to prevent an excess positive charge build up on a layer of material during a processing of an interface surface; and a shutter 319 that can be moved m to a blocking position to block the beam 60 during processing of the interface surface.

Figure 7A:
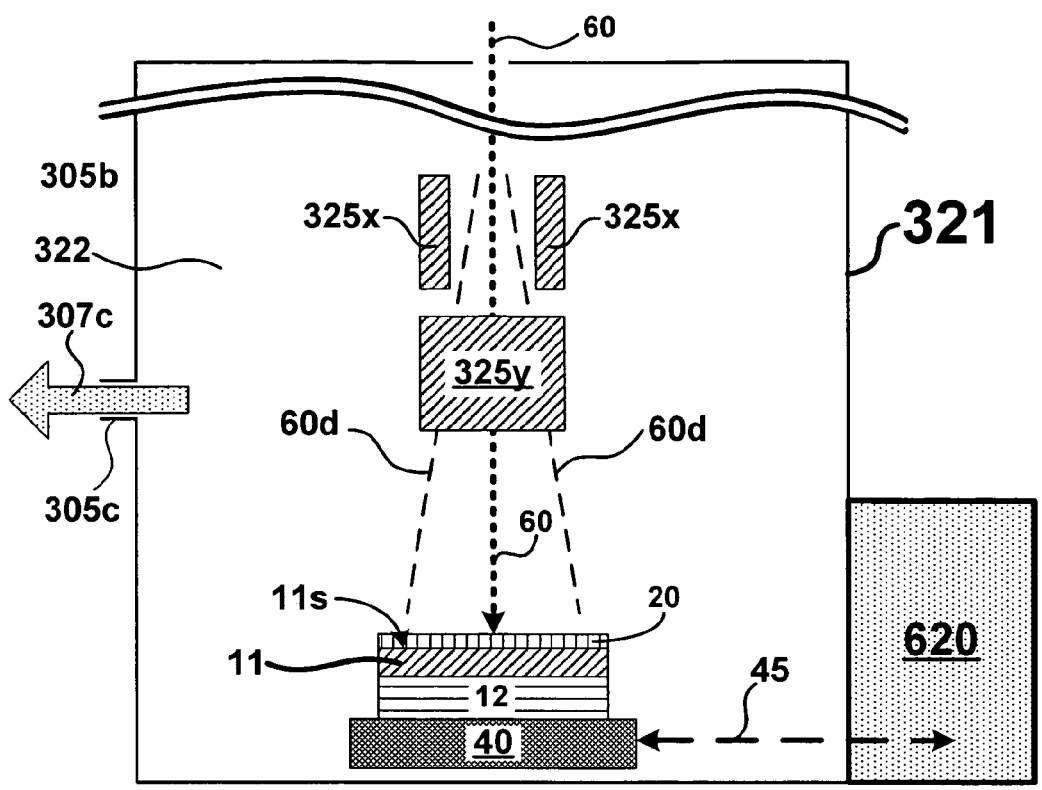
FIG. 7a is cross-sectional view depicting a first polarizing layer deposited on an interface surface of a precursor layer.
Figure 7B:
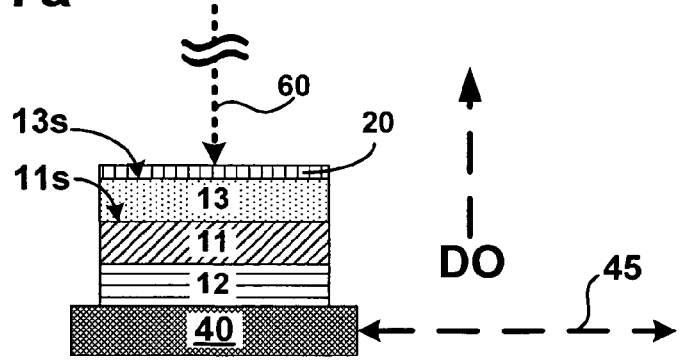
FIG. 7b is a cross-sectional view depicting a first polarizing layer deposited on an interface surface of a tunnel barrier layer.
Figure 11A:
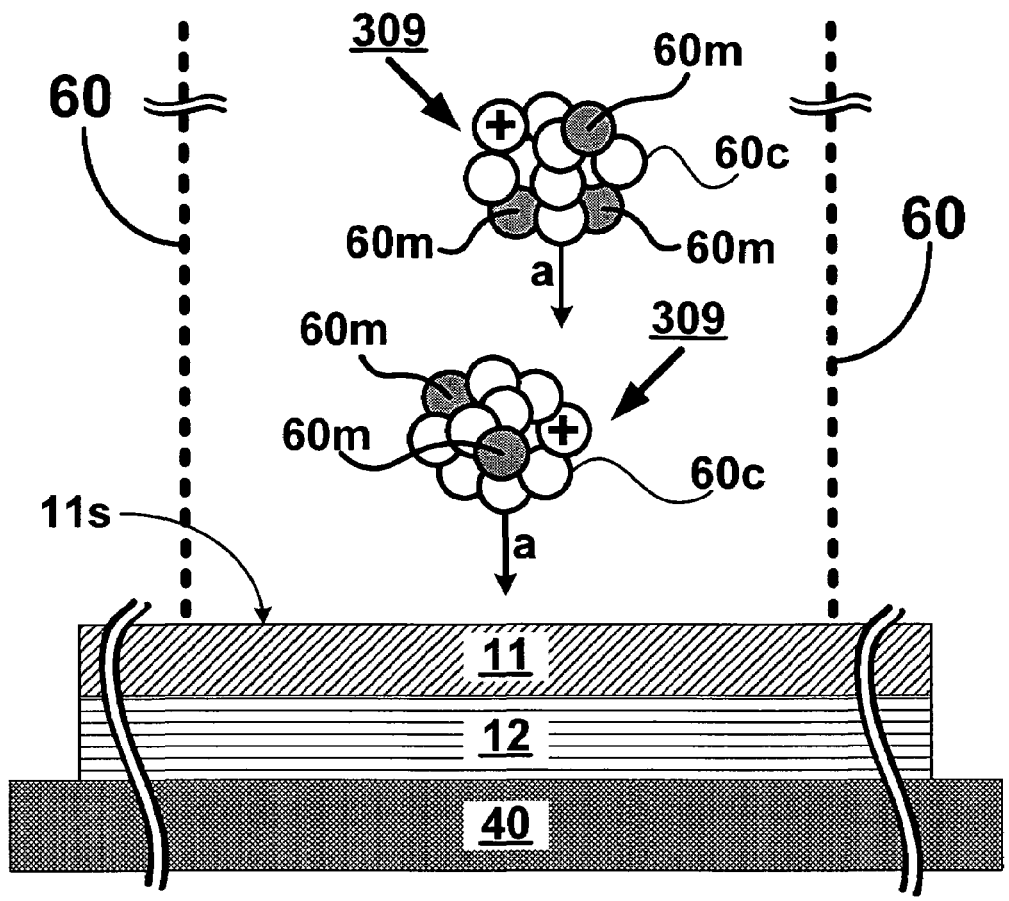
FIGS. 11a and 11b are cross-sectional views depicting an irradiating of an interface surface by a beam of gas cluster ions that include a polarizing material.

Referring now to FIG. 7a, at a stage 112, the beam 60 passes trough a processing section 321 of the GCIB 300 and irradiates an interface surface 11s of a layer of material 11 so that the gas cluster ions 309 impact on the interface surface 11s and disintegrate upon impact. As a result, a first polarizing layer 20 is deposited on the interface surface 11s. Turning to FIG. 11a, the beam 60 (denoted by heavy dashed lines) comprises a plurality of gas clusters ions 309 that have a net positive "+" charge. Alternatively, the gas clusters ion 309 can have a net negative "−" charge. The gas clusters ions 309 are moving in a direction a and are depicted just prior to their impact on the interface surface 11s. Each gas clusters ion 309 includes atoms and/or molecules 60c that are determined by a composition of the carrier gas 59 and atoms and/or molecules of the metal-organic compound 60m that are determined by a composition of the metal-organic gas 55mo. As described above, the metal-organic compound 60m includes a polarizing material. The processing section 321 can include a fitting 305c that is connected with a vacuum source 307c (not shown) for maintaining a precise vacuum in an interior 322 of the processing section 321.

Figure 11B:
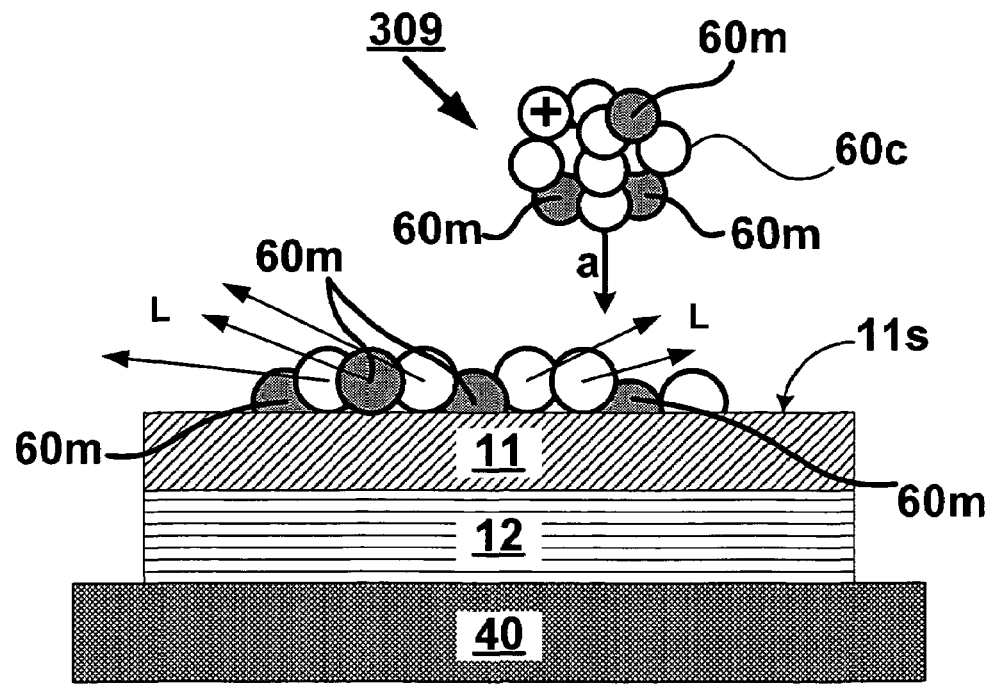

In FIG. 11b, upon impact with the interface surface 11s, the gas clusters ions 309 disintegrate and a portion of the weakly bound atoms/molecules deflect off of the interface surface 11s as depicted by arrows L. On the other hand, a portion of the weakly bound atoms/molecules remain in contact with the interface surface 11s. Accordingly, at least a portion of the metal-organic compounds 60m carried by the gas clusters ions 309 remain in contact with the interface surface 11s. An effect of the impact of the gas clusters ions 309 on the interface surface 11s will depend in part on an acceleration voltage used to accelerate the gas clusters ions 309, the mass of the gas clusters ions 309, the makeup of the constituent atoms and/or molecules that comprise the gas clusters ions 309, and a composition of the layer of material 11.

After the impact, at least a portion the polarizing material carried by the gas cluster ions 309 remains in contact with the interface surface 11s to form the first polarizing layer 20. As will be described in greater detail below, the layer of material 11 is one of many thin film layers of material that comprise a magnetoresistance device. Moreover, the layer of material 11 can be a layer that is deposited in a deposition order prior to a deposition of a tunnel barrier layer. Accordingly, the layer of material 11 can be a precursor layer and the precursor layer will be deposited over the other layers 12 that preceded the precursor layer in the deposition order. The layers 12 can be connected with a substrate 40 that supports and securely holds the layers positioned above it during processing of the interface surface 11s in the GCIB 300.

The substrate 40 can be a vacuum chuck, a platen, a motion controlled x-y-z stage, or the like. The processing section 321 may include a pair of electrostatic deflection electrodes (325x, 325y) for deflecting 60d the beam 60 along a plane (e.g. a x-y plane) during processing of the interface surface 11s and to scan the beam 60 over the interface surface 11s. As was mentioned above, the processing section 321 can include a fitting 305c that is connected to a vacuum source 307c (not shown). As will be described in greater detail below, a motion M of the substrate 40 can be used to move the substrate 40 relative to the beam 60 during the irradiating at the stage 112 as depicted by a x-y-z axis. The motion M can include rotational, translational, and angular movements of the substrate 40. Moreover, the motion M can be used to scan the beam 60 across the interface surface 11s.

Turning to FIG. 2, one example of a topology for a magnetoresistance device 10 includes a substrate (e.g. a wafer of silicon (Si) ), a first electrode of aluminum (Al), a buffer layer comprising tantalum (Ta) and nickel-iron (NiFe), an antiferromagnetic pinning layer (e.g. IrMn, PtMn, or MnFe), a reference layer of nickel-iron (NiFe), a tunnel barrier layer (also called a spacer layer) of a dielectric material (e.g. $Al_2O_3$), a data layer of nickel-iron (NiFe), a cap layer of tantalum (Ta), and a second electrode of aluminum (Al). The aforementioned layers of material are deposited on the substrate in a deposition order DO using deposition processes that are well understood in the microelectronics art.

The topology of FIG. 2 includes two polarizing layers (20, 22) that are formed by the GCIB 300 and are positioned at an interface $I_1$ and $I_2$ between the tunnel barrier layer and the reference and data layers respectively. In FIG. 3a, the polarizing layers (20, 22) sandwich a tunnel barrier layer 13 and depending on the topology of the magnetoresistance device 10 and the deposition order DO, the layers 11 and 15 can be a reference layer and a data layer respectively as depicted in FIG. 2, or the layers 11 and 15 can be a data layer and a reference layer respectively.

In contrast, the magnetoresistance device 10 may include a single polarizing layer positioned at the interface $I_1$ between the layer of material 11 and the tunnel barrier layer 13 (see 20 in FIG. 3b) or a single polarizing layer positioned at an interface $I_2$ between the tunnel barrier layer 13 and the layer 15 (see 20 in FIG. 3c). The method 100 can be used to form at least one polarizing layer and the discussion that immediately follows will focus on forming two polarizing layers (20, 22) as depicted in FIGS. 2 and 3a. A subsequent discussion will focus on the forming of the single polarizing layer 20 as depicted in FIGS. 3b and 3c.

Reference is now made to FIGS. 1, 3a, and 7a, where at the stage 112, a first polarizing layer 20 is formed on the interface surface 11s. As depicted in FIG. 3a, the layer material 11 is a precursor layer because it is a layer that is deposited prior to the tunnel barrier layer 13 in the deposition order DO. As was described above, the layer of material 11 is deposited over other layers 12 that were previously deposited in the deposition order DO and those layers are a subset of the many thin film layers that comprise the magnetoresistance device 10. For example, the layers 12 can represent all of the layers below the NiFe reference layer of FIG. 2. After the first polarizing layer 20 is deposited by the GCIB 300 at the stage 112, the tunnel barrier layer 13 can be deposited on the first polarizing layer 20. Consequently, after the deposition of the tunnel barrier layer 13, the first polarizing layer 20 is positioned at an interface $I_1$ between the layer of material 11 and the tunnel barrier layer 13 (see FIG. 2).

In FIG. 1, at a stage 114, the tunnel barrier layer 13 can be deposited as part of a separate fabrication process as emphasized by a heavy dark line for the NO branch or the tunnel barrier layer 13 can be deposited as part of the method 100 as indicated by a YES branch. If the NO branch is selected, then the magnetoresistance device 10 can be removed from the GCIB 300 and transported to a separate processing apparatus where a deposition of the tunnel barrier layer 13 is performed. Accordingly, the tunnel barrier layer 13 is deposited on a surface 20s of the first polarizing layer 20 by the separate processing apparatus As one example, the separate processing apparatus can be a sputtering deposition apparatus or a chemical vapor deposition (CVD) apparatus.

Figure 9:
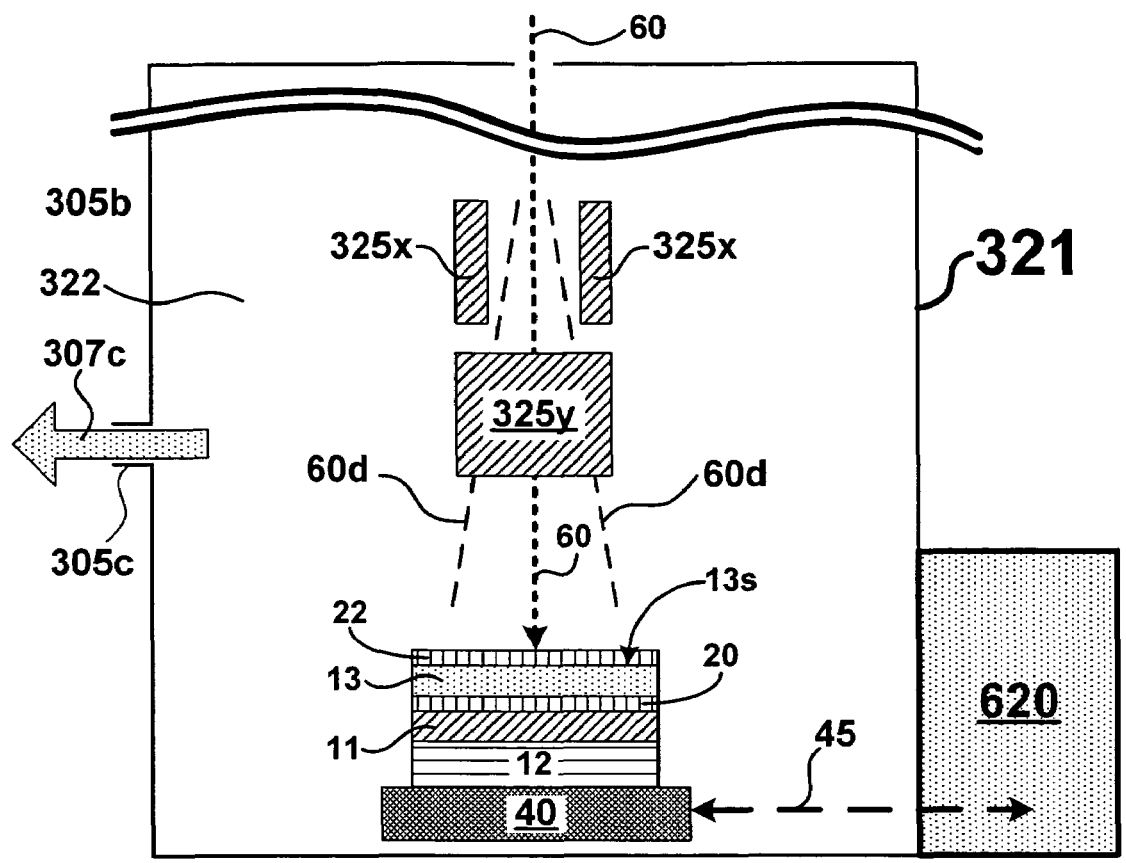
FIG. 9 is cross-sectional view depicting a second polarizing layer deposited on an interface surface of a tunnel barrier layer.

Turning to FIG. 9, after the deposition of the tunnel barrier layer 13 in the separate processing apparatus, the magnetoresistance device 10 can be returned to the GCIB 300. At a stage 118, a YES branch is selected for the forming of a second polarizing layer. Subsequently, at a stage 120, an interface surface 13s of the previously formed tunnel barrier layer 13 is irradiated by the beam 60 to deposit a second polarizing layer 22 on the interface surface 13s. Consequently, after the stage 120, the tunnel barrier layer 13 is sandwiched between two polarizing layers (20, 22).

Figure 8:
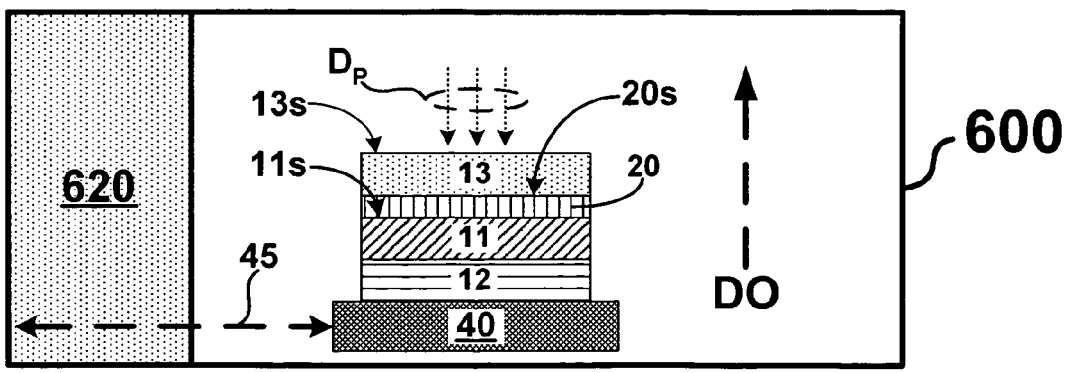
FIG. 8 is a cross-sectional view of a depositing of a tunnel barrier layer on a first polarizing layer.

Alternatively, in FIG. 8, if the YES branch is selected at the stage 114, then the substrate 40 can be transported 45 from the GCIB 300 to a processing unit 600 that is connected with the GCIB 300 via a load lock 620, or the like. At a stage 116, the tunnel barrier layer 13 is deposited $D_p$ on the surface 20s of the first polarizing layer 20 by the processing unit 600. After the deposition $D_p$, the substrate 40 can be transported 45 back to the GCIB 300 via the load lock 620 so that the second polarizing layer 22 can be deposited on the interface surface 13s of the tunnel barrier layer 13. Accordingly, at the stage 118, a YES branch is selected and at the stage 120 the interface surface 13s is irradiated by the beam 60 to form the second polarizing layer 22 as was described above in reference to FIG. 9. One advantage to using the load lock 620 and the processing unit 600 is that a workpiece (e.g. the device 10) can be moved back and forth 45 without breaking vacuum or exposing the workpiece to contamination.

Figure 10:
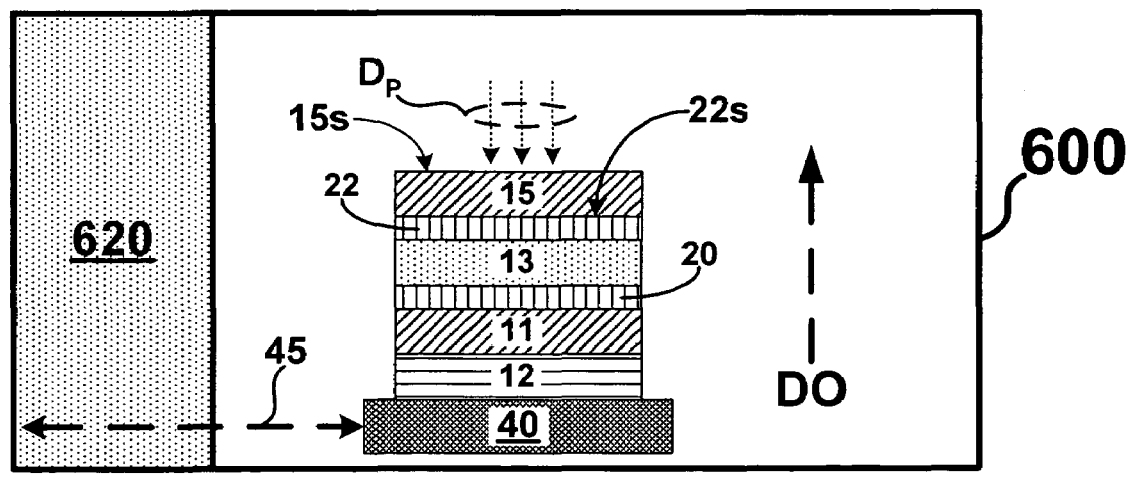
FIG. 10 is a cross-sectional view depicting a depositing of a subsequent layer of material on a second polarizing layer.

In FIG. 10, after the deposition of the second polarizing layer 22 at the stage 120, additional layers of material 21 (see FIGS. 2 and 3) can be deposited $D_p$ over the second polarizing layer 22 in the deposition order DO. The additional depositions can occur in the processing unit 600 or in a separate processing apparatus. For example, the additional layers of material 21 can be the layers or material that are positioned above the second polarizing layer 22 in FIG. 2.

The deposition of the second polarizing layer 22 at the stage 120 occurs in the same manner as the deposition of the first polarizing layer 20 at the stage 112 as was described above in reference to FIGS. 11a and 11b. That is, after the impact of the gas cluster ions 309, a portion of the metal-organic compound carried by the gas cluster ions 309 remains in contact with the tunnel barrier layer 13 to form the second polarizing layer 22 on the interface surface 13s. Consequently, the second polarizing layer 22 is positioned at an interface $I_2$ between the tunnel barrier layer 13 and the next layer in the deposition order DO. For example, the interface $I_2$ can be positioned between the tunnel barrier layer 13 and a data layer 15 of the magnetoresistance device 10 (see FIG. 2).

Because the deposition order DO will be application specific, topologies for the magnetoresistance device 10 include but are not limited to the following relationships between the thin film layers. The layer of material 11 can be a data layer with the first polarizing layer 20 deposited on the interface surface 11s, followed by the tunnel barrier layer 13 deposited on the first polarizing layer 20, followed by the second polarizing layer 22 deposited on the interface surface 13s, and a reference layer can be deposited on the second polarizing layer 22.

Alternatively, the layer of material 11 can be a reference layer with the first polarizing layer 20 deposited on the interface surface 11s, followed by the tunnel barrier layer 13 deposited on the first polarizing layer 20, followed by the second polarizing layer 22 deposited on the interface surface 13s, and a data layer can be deposited on the second polarizing layer 22. In either topology, the data and reference layers can be made from a ferromagnetic material and the tunnel barrier layer 13 can be made from a dielectric material.

Figure 12A:
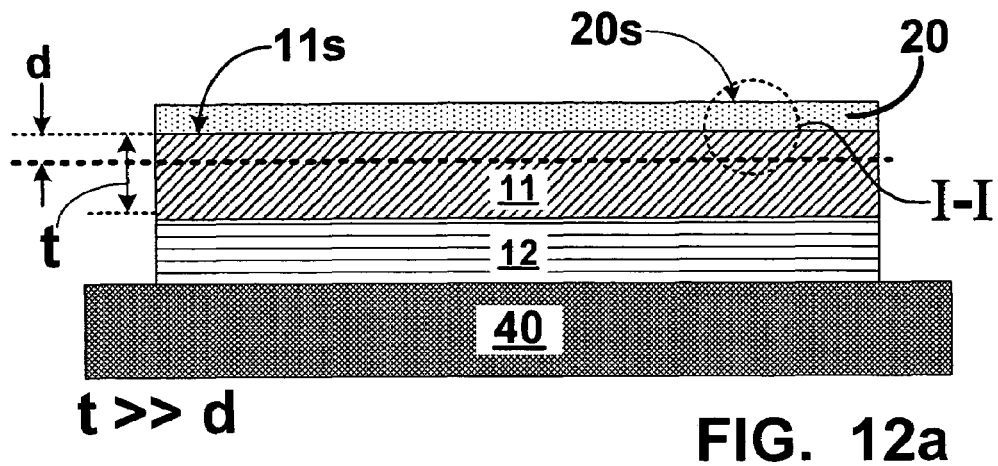
FIG. 12a is a cross-sectional view depicting a first polarizing layer deposited on an interface surface of a precursor layer.

Referring now to FIG. 12a, the first polarizing layer 20 is deposited on the interface surface 11s of the layer of material 11. However, due to a momentum of the gas cluster ions 309, the impact of the gas cluster ions 309 with the interface surface 11s can result in some of the polarizing material (e.g. 60m) penetrating inward of the interface surface 11s by a predetermined distance d. The predetermined distance d is much less than a thickness t of the layer of material 11 (i.e. t>>d). As one example, if the thickness t is 100 nm, then the predetermined distance d can be about 15 Å (i.e. 1.5 nm). The actual value of the predetermined distance d will be application specific. The predetermined distance d can be measured in monolayers (e.g. ≧1.0 monolayer) or in sub-monolayers (e.g. <1.0 monolayer) and will depend on the material and composition of the layer of material 11, the materials selected for the metal-organic compounds 60m, the parameters of the GCIB 300 (e.g. acceleration voltage), and the length of bonds between the atoms of the layer of material 11 and the metal-organic compounds 60m. As another example, the predetermined distance d can be in a range from about 0.5 monolayers to about 2.0 monolayers.

Figure 12B:
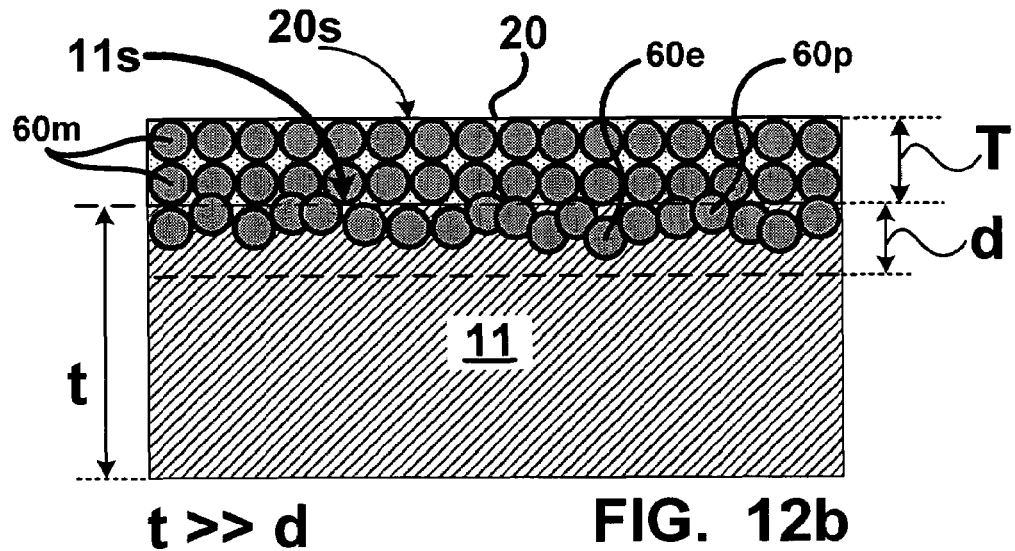

A section I—I of FIG. 12a is enlarged and depicted in greater detail in FIG. 12b. The enlarged section illustrates a position of the metal-organic compounds 60m relative to the interface surface 11s. The metal-organic compounds 60m may be distributed throughout the interface surface 11s in proportions that can vary. A portion of the metal-organic compounds 60m can be positioned on the interface surface 11s (i.e. they are positioned on the uppermost surface) and form the first polarizing layer 20 having a thickness T. The thickness T can be measured in monolayers. An actual thickness of a monolayer will depend on the species (e.g. Fe, Co or CoFe) of the polarizing material and on a length of the bonds between the atoms and/or the molecules of the first polarizing layer 20. The thickness T can be in a range from about 1.0 monolayer to about 5.0 monolayers. Preferably, the thickness T of the first polarizing layer 20 is uniform across the interface surface 11s.

Another portion of the metal-organic compounds 60p can be positioned partially in the interface surface 11s (i.e. partially within the predetermined distance d). Yet another portion of metal-organic compounds 60e can be positioned entirely within the interface surface 11s (i.e. they are disposed entirely within the layer of material 11). Therefore, a contact of the metal-organic compounds 60m with the interface surface 11s comprises any of the configurations depicted in FIG. 12b. That is, the metal-organic compounds 60m may be positioned on the interface surface 11s, the metal-organic compounds 60p may be positioned partially inward of the interface surface 11s, and the metal-organic compounds 60e may be positioned entirely within the layer of material 11.

Figure 13A:
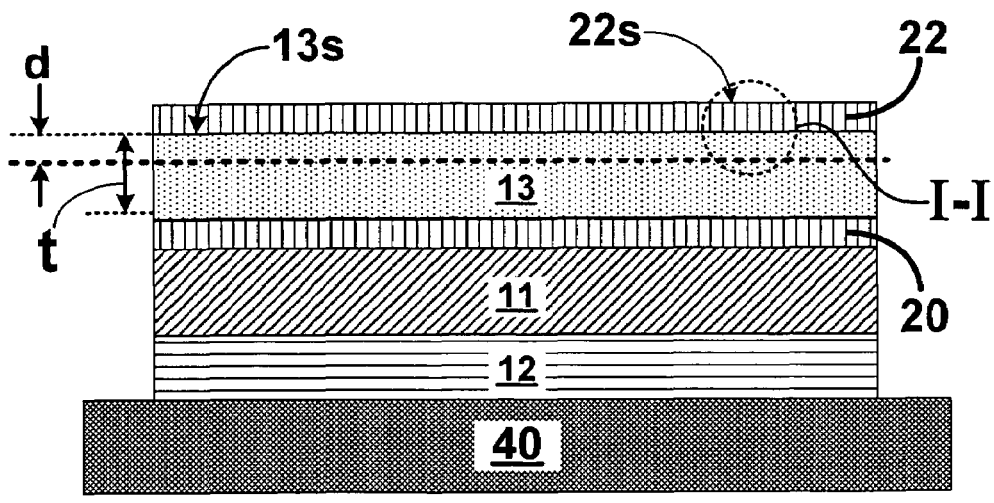
FIG. 13a is a cross-sectional view depicting a second polarizing layer deposited on an interface surface of a tunnel barrier layer.

Similarly, in FIGS. 13a and 13b, the metal-organic compounds 60m in the second polarizing layer 22 may be positioned on the interface surface 13s, the metal-organic compounds 60p may be positioned partially inward of the interface surface 13s, and the metal-organic compounds 60e may be positioned entirely within the tunnel barrier layer 13.

Turning now to FIGS. 4a and 4b, the interface surface 11s of the layer of material 11 need not be a substantially planar surface (i.e. flat) as depicted in FIGS. 3a through 3c. For example, a topography of the interface surface 11s may include an initial surface roughness $r_0$ as depicted by variations in surface height (i.e. undulations) on the interface surface 11s. The surface roughness $r_0$ can be measured as a RMS surface roughness. Because the interface surface 11s is not flat, a uniform irradiation of the interface surface 11s with the metal-organic compounds 60m may not be possible due to the first polarizing layer 20 conformally covering the underlying interface surface 11s. Consequently, in some applications it may be desirable to smooth the interface surface 11s prior to or during the stage 112. Preferably, the GCIB 300 is used to perform a surface smoothing irradiation process on the interface surface 11s to reduce the surface roughness $r_0$. Because the layer of material 11 and the tunnel barrier layer 13 are very thin films, a process such as chemical mechanical planarization (CMP) is not likely to be a suitable process for planarizing the interface surfaces of those layers. Furthermore, the chemical slurries used in CMP may damage or contaminate the thin film layers in the magnetoresistance device 10.

For instance, in FIG. 5, the valve V1 can be closed to cut off the flow of the metal-organic gas 55mo to the manifold 58. The valve V0 is opened to allow only the carrier gas 59 to flow into the stagnation chamber 304 so that the gas cluster ions 309 in the beam 60 are used for smoothing the interface surface 11s. The process of using a GCIB for surface smoothing are well understood in the microelectronics art and good literature exists on GCIB surface smoothing.

An acceleration voltage of the GCIB 300 can be increased to increase a momentum of the gas cluster ions 309 in the beam 60. The increased momentum can be used to hasten the smoothing of the interface surface 11s and/or to effectuate the smoothing when the composition of the layer of material 11 requires additional force created by the impact of the gas cluster ions 309 with the interface surface 11s. The momentum of the gas cluster ions 309 can also be increased by selecting a carrier gas 59 that includes atoms and/or molecules that have a higher mass.

Referring now to FIG. 4b, after the surface smoothing process, a surface roughness $r_1$ of the interface surface 11s is reduced (i.e. $r_1 < r_0$). Subsequently, the irradiation at the stage 112 can proceed using the composite gas 61c to effectuate the bombardment of the interface surface 11s with the metal-organic compounds 60m. Smoothing of the interface surface 11s can occur simultaneously with the irradiating at the stage 112 because the impact of the gas cluster ions 309 on the interface surface 11s can result in the aforementioned surface smoothing. The extent to which the initial surface roughness $r_0$ is reduced to the surface roughness $r_1$ during the stage 112 will depend on several factors including but not limited to a mass and a momentum of the gas cluster ions 309. Process parameters of the GCIB 300 (e.g. acceleration voltage) can be controlled to cause surface smoothing or to prevent surface smoothing during the irradiating at the stage 112.

Similarly, in FIGS. 4c and 4d, the interface surface 13s of the tunnel barrier layer 13 can have an initial surface roughness $r_0$ reduced to a surface roughness $r_1$ (i.e. $r_1 < r_0$) using the aforementioned surface smoothing process. The surface smoothing can occur prior to the stage 120 or during the stage 120. When only a single polarizing layer 20 is to be formed, then the surface smoothing of the interface surface 13s can occur prior to the stage 112 or during the stage 112.

Figure 14:
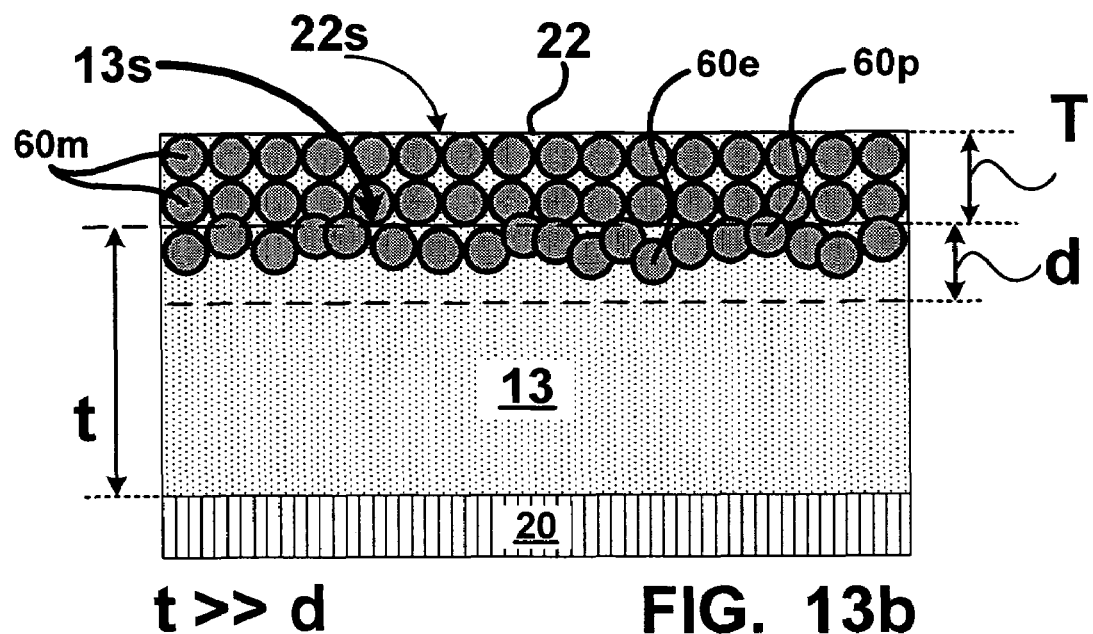
FIG. 14 is a top plan view depicting examples of a relative motion between a beam of gas cluster ions and an interface surface.
Figure 14:
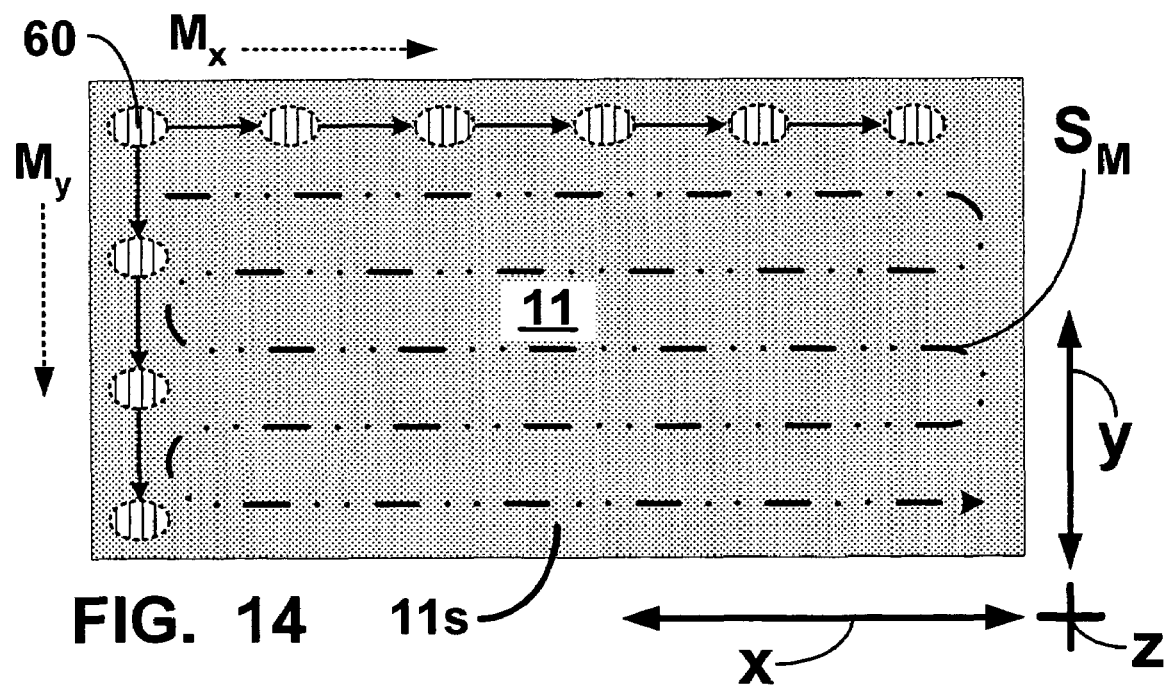

During the irradiating at the stage 112, it may be desirable to target the beam 60 over the entirety of the interface surface 11s or over a only a portion of the interface surface 11s. In FIG. 14, the layer of material 11 can be moved relative to the beam 60 (i.e. the beam 60 is held stationary) during the irradiating at the stage 112 so that the beam 60 irradiates some or all of the interface surface 11s. The substrate 40 can be connected with a mechanical or an electrical-mechanical means for moving the substrate 40 during the irradiating at the stage 112. As one example, the substrate 40 can be connected with a precision motioned controlled x-y-z stage that is controlled by a computer or a dedicated control unit.

The substrate 40 can be moved in a x-direction denoted by a dashed arrow $M_x$, in a y-direction as denoted by a dashed arrow $M_y$, or simultaneously in both directions ($M_x$ and $M_y$). Consequently, the interface surface 11s is moved relative to the beam 60. As another example, a micrometer stage (not shown) connected with the substrate 40 can be used to impart motion (see M in FIG. 6) along any selected axes of motion such as along the x-y-z axes depicted in FIGS. 6 and 14 (note: in FIG. 14, the z axis is into the drawing sheet). The motion M can include rotation, linear translation, and tilting of the substrate 40. The motion M can also be used to effectuate the equivalent of a scanning motion by the beam 60 as depicted by a series of dashed lines $S_M$.

As was described above in reference to FIG. 6, the beam 60 can be moved while the substrate 40 is held stationary by electrostatically deflecting the beam 60 using the electrostatic deflection electrodes ($325_x$, $325_y$). The deflection electrodes $325_x$ can be used to move the beam 60 in the $M_x$ direction along the x-axis X and the deflection electrodes $325_y$ can be used to move the beam 60 in the $M_y$ direction along the y-axis y. The electrostatic deflection electrodes ($325_x$, $325_y$) can be used in combination to impart a motion that is a vector in the x-y plane. The electrostatic deflection electrodes ($325_x$, $325_y$) may also be used to scan the beam 60 across the interface surface 11s while the substrate 40 is held stationary.

For example, the beam 60 can be scanned $S_M$ as depicted in FIG. 14. Scanning of the beam 60 can include a raster scanning. Because a range of beam deflection provided by the deflection electrodes ($325_x$, $325_y$) may be too small to cover an entirety of the interface surface 11s, it may be necessary to move both the beam 60 and the substrate 40 to cover a majority or all of the interface surface 11s. Accordingly, one skilled in the art will appreciate that the beam 60 and the interface surface 11s can be moved M relative to each other by applying the above describe motions to both the beam 60 and the substrate 40 at the same time. Furthermore, if the beam 60 has a small beam width, then the beam 60 can be scanned or raster scanned while the substrate 40 is in motion so that a larger area of the interface surface 11s is irradiated during the stage 112. The aforementioned relative scanning motions of the beam 60 and the substrate 40 apply to the interface surface 13s of the tunnel barrier layer 13 during the stage 112 or the stage 120.

Figure 15A:
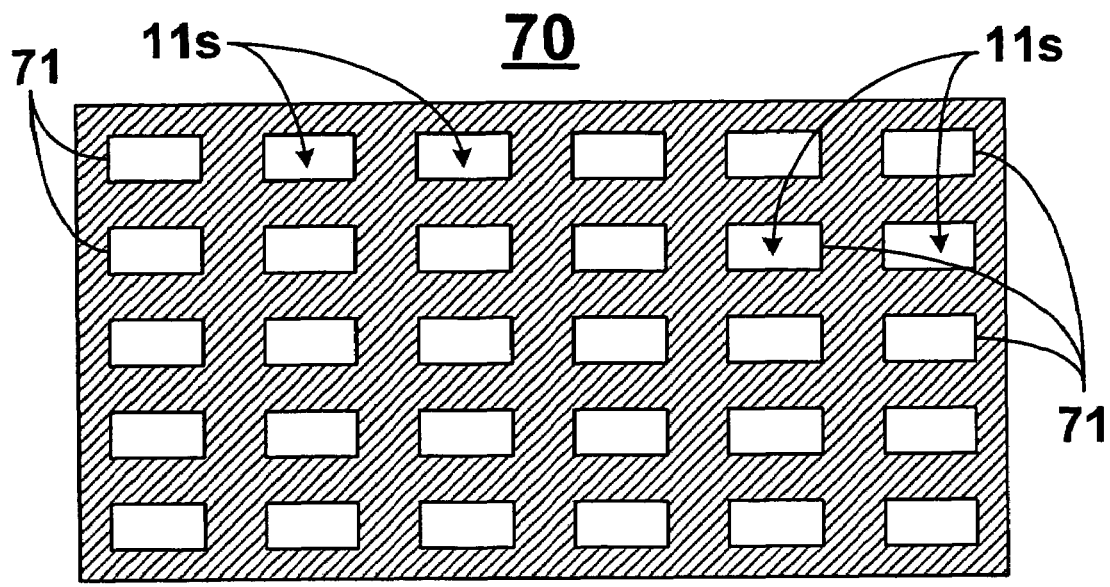
FIGS. 15a through 15c depicting a mask layer positioned relative to an interface surface.
Figure 15B:
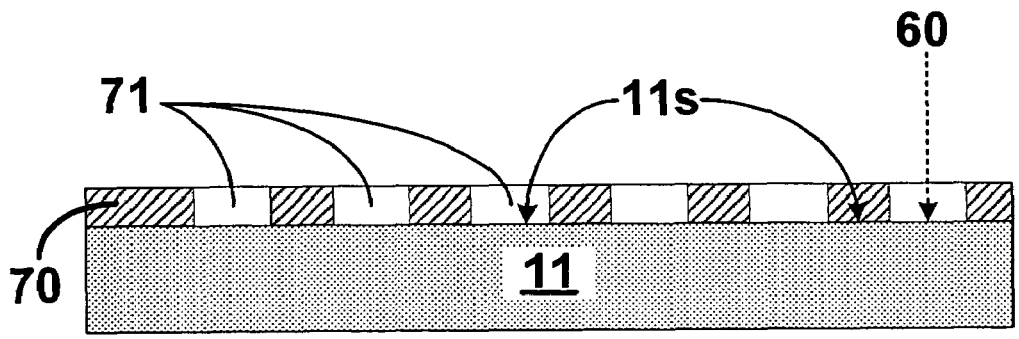
Figure 15C:
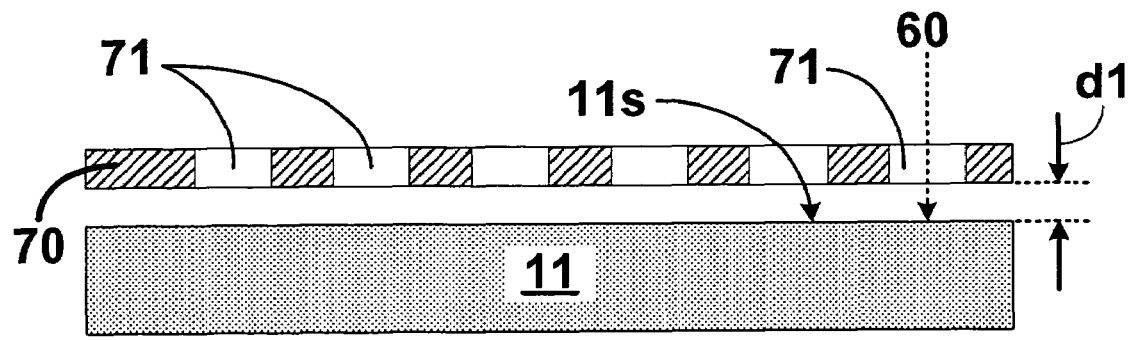

In some applications it may be desirable to control which areas on the interface surface 11s are irradiated by the beam 60. In FIGS. 15a through 15c, a mask layer 70 including one or more apertures 71 can be positioned over the interface 11s. The apertures 71 are through holes that extend all the way through the mask layer 70 so that the beam 60 passes through the apertures 71 and the gas cluster ions 309 impact on those portions of the interface surface 11s that are exposed by the apertures 71. The mask 70 can be used to restrict the impact area of the beam 60 to portions of the interface surface 11s where the first polarizing layer 20 is to be formed. For example, the apertures 71 can define regions where a plurality of the magnetoresistance devices 10 are to be formed.

The mask layer 70 may be positioned in contact with the interface surface 11s as depicted in FIG. 15b or the mask layer 70 may be positioned over the interface surface 11s and separated by a distance d1 as depicted in FIG. 15c. Preferably, the distance d1 is as small as possible to prevent the beam 60 from straying outside the bounds defined by the apertures 71. The mask layer 70 can be made from any material that can be patterned including but not limited to a material that can be lithographically patterned and etched using processes that are well understood in the microelectronics art. The mask layer 70 can be deposited on the interface surface 11s using well known semiconductor processes and then lithographically patterned and etched to form the apertures 71. For example, the mask layer 70 can be a photoresist material that is spin deposited on the interface surface 11s. The actual shape of the apertures 71 will be application dependent and need not be rectangular as depicted in FIG. 15a.

Figure 16:
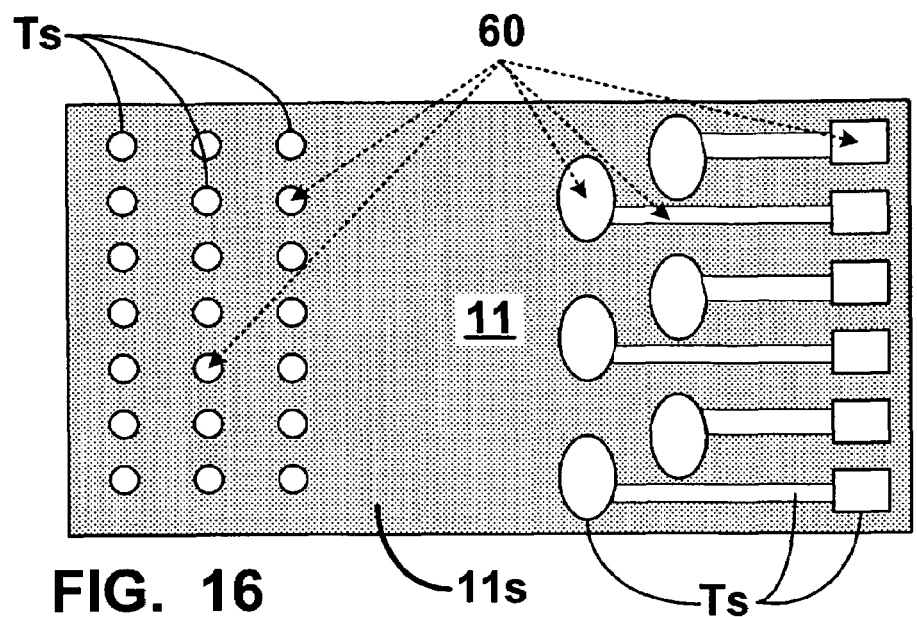
FIG. 16 is a top plan view of a predetermined site on an interface surface that is targeted by a beam of gas cluster ions.

In FIG. 16, the beam 60 is targeted at one or more specific sites Ts on the interface surface 11s to form the first polarizing layer 20. Therefore, the irradiating at the stage 112 is controlled so that the beam 60 irradiates the interface surface 11s only at the specific sites Ts. The aforementioned moving M of the beam 60, the interface surface 11s, or both the beam 60 and the interface surface 11s can be used to target the specific sites Ts. A computer program (e.g. a CAD program) can be used to control the moving M of the substrate 40 in the GCIB 300 and to determine a shape of the specific sites Ts as irradiated (e.g. as painted) on the interface surface 11s. As an example, the specific sites Ts can have a circular shape or a complex shape as depicted in FIG. 16. Similarly, the interface surface 13s can be targeted at one or more specific sites Ts to form the second polarizing layer 22.

Figure 17:
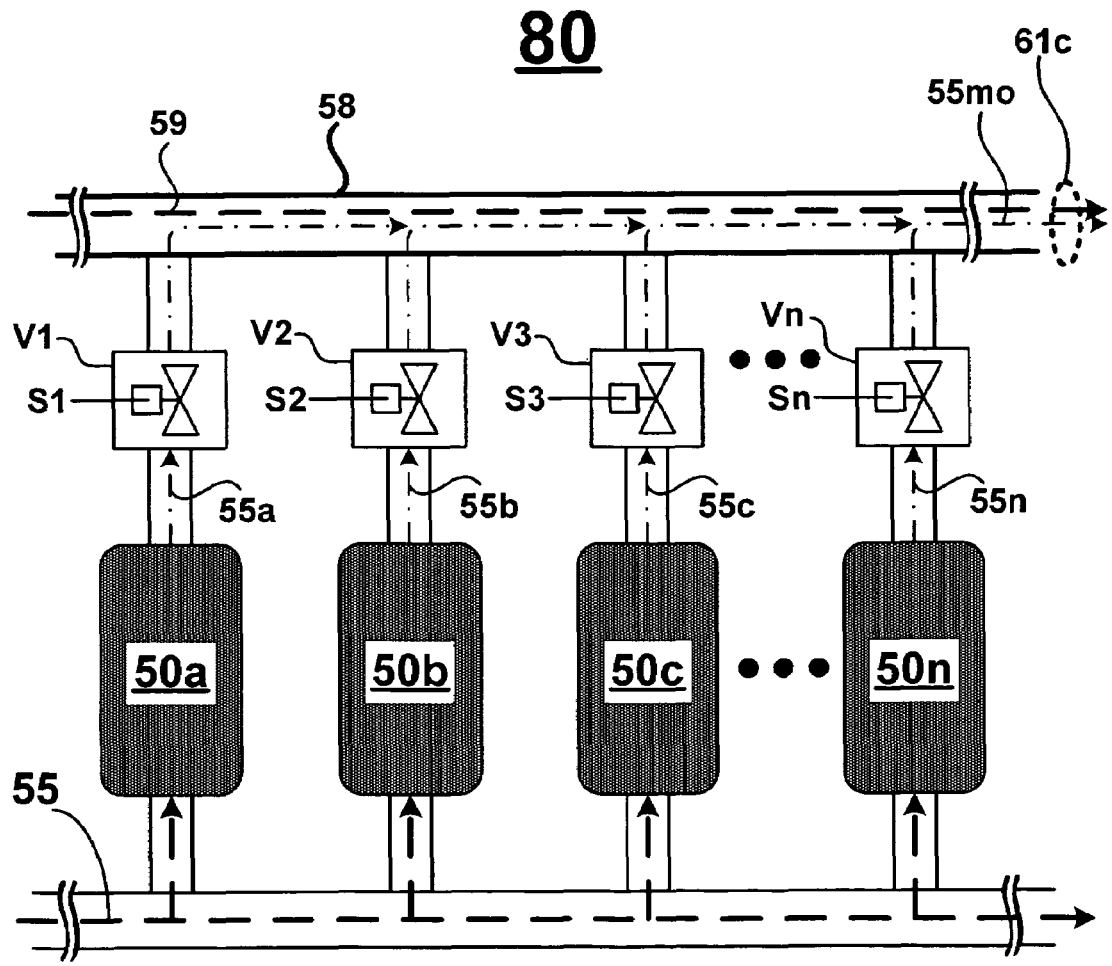
FIG. 17 is a schematic depicting an example of a plurality of metal-organic generators for generating a metal-organic gas that can include a plurality of different metal-organic compounds.

The composite gas 61c can include one or more metal-organic compounds that are carried by the metal-organic gas 55mo. During a course of the irradiating at the stage 112 and/or at the stage 118, it may be desirable to alter the metal-organic compounds 60m that are present in the gas cluster ions 309. In FIG. 17, in a multiple generator system 80, the gas 55 is supplied to metal-organic generators (50a, 50b, 50c, and 50n) each of which contains a different metal-organic source material 51. The generators (50a, 50b, 50c, and 50n) in the multiple generator system 80 may be like the metal-organic generator 50 depicted in FIG. 5.

Valves (V1, V2, V3, and Vn) control a flow of metal-organic gasses (55a, 55b, 55c, 55n) that are generated by the metal-organic generators (50a, 50b, 50c, 50n). The flow of the gasses (55a, 55b, 55c, 55n) is controlled by signals (S1, S2, S3, Sn) which can open, close, or partially open/close their respective valves. A computer or dedicated control unit (not shown) can be used to control the generators and their respective valves. The gas flows (55a, 55b, 55c, and 55n) from the reactors are combined in a manifold 58 where they form the metal-organic gas 55mo that is subsequently mixed with the carrier gas 59 to form the composite gas 61c. As was described above in reference to FIG. 5, the composite gas 61c is supplied to the gas feed tube 302 in the gas source chamber 301 of the GCIB 300.

Figure 18:
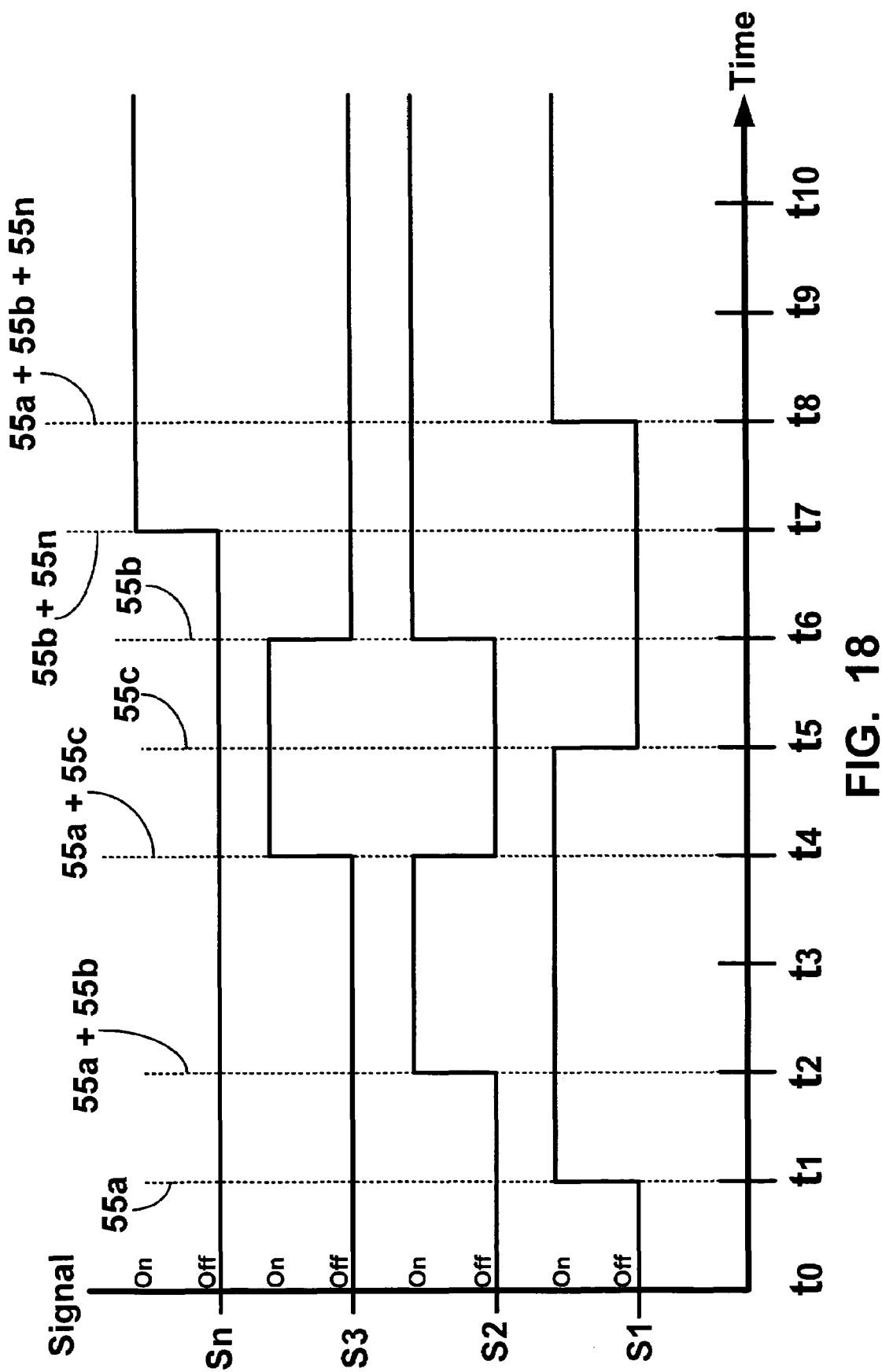
FIG. 18 is a timing diagram depicting a selecting of one or more metal-organic gasses to be combined with a carrier gas to form a composite gas to be supplied to a gas cluster ion beam apparatus.

In FIG. 18, a timing diagram depicts Time on a x-axis and a state (i.e. "On" or "Off") for the signals (S1, S2, S3, Sn) on a y-axis. The signals (S1, S2, S3, Sn) control valves (V1, V2, V3, Vn) as depicted in the multiple generator system 80 of FIG. 17. Therefore, if a signal is "On", then the valve it controls is on and if a signal is "Off", then the valve it controls is off. The composition of the metal-organic gas 55mo is determined by a combination of the metal-organic gasses (55a, 55b, 55c, 55n). From t0 to t2, the metal-organic gas 55mo comprises the metal-organic gas 55a from generator 50a. From t2 to t4, the metal-organic gas 55mo comprises the metal-organic gasses 55a and 55b from generators 50a and 50b. From t4 to t5, the metal-organic gas 55mo comprises the metal-organic gasses 55a and 55c from generators 50a and 50c. From t5 to t6, the metal-organic gas 55mo comprises the metal-organic gas 55c from generator 50c. From t6 to t7, the metal-organic gas 55mo comprises the metal-organic gas 55b from generator 50b. From t7 to t8, the metal-organic gas 55mo comprises the metal-organic gasses 55b and 55n from generators 50b and 50n. Finally, from t8 onward, the metal-organic gas 55mo comprises the metal-organic gasses 55a, 55b, and 55n from generators 50a, 50b, and 50n.

Accordingly, during the course of the irradiating at the stage 112 and/or the stage 120, the beam 60 will contain different metal-organic compounds 60m and different combinations of metal-organic compounds 60m. The units of Time in FIG. 18 will be application specific and could be in units of seconds, minutes, or hours, for example. The signals (S1, S2, S3, Sn) may cause the valves (V1, V2, V3, Vn) to fully open and fully close or the signals may cause the valves to partially open/close so that a flow rate of the metal-organic gasses ($55a$, $55b$, $55c$, $55n$) from the generators is either increased or decreased by the signals.

The configuration depicted in FIGS. 5 and 17 can also be used to modulate a concentration of the metal-organic compound $60m$ that is in contact with the interface surfaces ($11s$, $13s$). The valves (V0, V1, V2, V3, Vn) and the signals (S0, S1, S2, S3, Sn) can be used to control gas flow rates and/or a mixing ratio of the metal-organic gas $55mo$ with the carrier gas 59 to increase or to decrease a concentration of the metal-organic compound $60m$ in the metal-organic gas $55mo$. The heat H applied to the metal-organic source material 51 can also be increased or decreased to increase or decrease a rate at which the metal-organic compound $60m$ contained in the metal-organic source material 51 dissociate into the gas 55.

User controllable parameters for the GCIB 300 can be used to affect one or more properties of the gas cluster ions 309 in the beam 60. As one example, in FIG. 6, the ionization filaments 313 in the ionization chamber 311 can be used to increase an ionization state of the gas cluster ions 309 during the ionizing at the stage 108. By increasing the ionization state of the gas cluster ions 309, a chemical reactivity of the metal-organic compound $60m$ with the interface surfaces ($11s$, $13s$) can be increased.

As a second example, an acceleration voltage applied to the high voltage electrodes of the acceleration section 315 can be increased to increase an acceleration of the gas cluster ions 309 thereby increasing a momentum of the gas cluster ions 309. The increased momentum can be used to control the predetermined depth d at which the metal-organic compounds $60m$ are positioned in the interface surfaces ($11s$, $13s$).

As a third example, the irradiating at the stage 112 and/or at the stage 120 can be continued until a desired concentration of the metal-organic compound $60m$ is in contact with the interface surfaces ($11s$, $13s$). For instance, the beam 60 can be held stationary at a desired site on the interface surfaces ($11s$, $13s$) until the desired concentration of the metal-organic compound $60m$ is obtained at the site (i.e. a desired concentration of the element Fe, Co, or CoFe). The beam 60 may also be repeatedly scanned over the interface surfaces ($11s$, $13s$) until the desired concentration of the metal-organic compound $60m$ is obtained.

Another parameter that may be controlled to obtain the desired concentration of the metal-organic compound $60m$ is an irradiation time during the irradiating at the stage 112 and/or the stage 120. Referring again to FIGS. $12b$ and $13b$, the irradiating at the stages (112, 118) can be continued until a desired thickness T of the first and second polarizing layers (20, 22) is obtained. Continuing the irradiating can also be used to increase both the concentration of the metal-organic compound $60m$ and the thickness T.

One advantage to the method 100 is that the contact of the metal-organic compound $60m$ with the interface surfaces ($11s$, $13s$) can result in the aforementioned chemical reaction between metal-organic compound $60m$ and the interfaces surfaces ($11s$, $13s$). The chemical reaction can be selected to ensure that an effective first and second polarizing layer (20, 22) are formed. The effect of the chemical reaction will be substantially located within a region defined by the interface surfaces ($11s$, $13s$) (see FIGS. $12b$ and $13b$) so that the chemical reaction changes a property of the interfaces surfaces ($11s$, $13s$) without changing a property of the layers (11, 13). Additionally, the substrate 40 and/or the processing section 321 can be heated or cooled to increase or decrease a temperature of the layers (11, 13). The heating or cooling can be used to control the chemical reaction.

The description above has focused on the forming of the first and second polarizing layers (20, 22). However, the method 100 can be used to form a single polarizing layer. Reference is now made to FIG. 1 and FIG. $3b$, where at the stage 112, a first polarizing layer 20 is formed on the interface surface $11s$ of the layer of material 11. The layer of material 11 can be made from a ferromagnetic material (e.g. a data layer or a reference layer). As was described above, the interface surface $11s$ can be can undergo a surface smoothing process prior to or during the irradiating at the stage 112 (see FIGS. $4a$ and $4b$).

After the forming of the first polarization layer 20 at the stage 112, the tunnel barrier layer 13 may be deposited on a surface $20s$ of the first polarization layer 20. In FIG. 1, at the stage 114, if the NO branch is selected, then the forming of the tunnel barrier layer 13 may be accomplished in a separate processing unit as was described above. After the tunnel barrier layer 13 has been formed, there is no need to form a second polarizing layer and the NO branch at the stage 118 is selected and the method 100 can terminate at the stage 122. On the other hand, if the YES branch is selected at the stage 114, then the tunnel barrier layer 13 is formed on the first polarization layer 20 at the stage 116. The forming of the tunnel barrier layer 13 may be accomplished using the processing unit 600 and the load lock 620 as was described above in reference to FIG. 8. After the forming of the tunnel barrier layer 13, there is no need to form a second polarizing layer and the NO branch at the stage 118 is selected and the method 100 can terminate at the stage 122.

Turning now to FIG. 1 and FIG. $3c$, the first polarizing layer 20 can be formed on the interface surface $13s$ of an already formed tunnel barrier layer 13 at the stage 112 as depicted in FIG. $7b$. For example, the magnetoresistance device 10 may have already been processed up to the tunnel barrier layer 13 and it is desired to form a polarizing layer on the surface $13s$. After the forming of the first polarizing layer 20, the NO branches of the stages 114 and 118 are selected and the method 100 can terminate at the stage 122. As was described above, the interface surface $13s$ can be can undergo a surface smoothing process prior to or during the irradiating at the stage 112 (see FIGS. $4c$ and $4d$). The tunnel barrier layer 13 may be formed using the aforementioned processing unit 600 and the load lock 620 or may be formed in a separate processing unit.

The above descriptions referencing FIG. 6 and FIGS. $11a$ through 18, also apply to the forming of the first polarization layer 20 on the interface surfaces ($11s$, $13s$). The formation of a single polarizing layer 20 as opposed to two polarizing layers (20, 22) may be desirable when the effect of the polarizing material at the interface ($I_1$, $I_2$) between the tunnel barrier layer 13 and the layer adjacent to the tunnel barrier layer 13 (e.g. the data layer or the reference layer) is sufficient to result in an increase in the signal-to-noise ratio $\Delta R/R$ for the tunneling resistance. Accordingly, when a single polarizing layer is not sufficient to increase the signal-to-noise ratio $\Delta R/R$ to an acceptable value, then the aforementioned two polarizing layers (20, 22) can be used.

Figure 19:
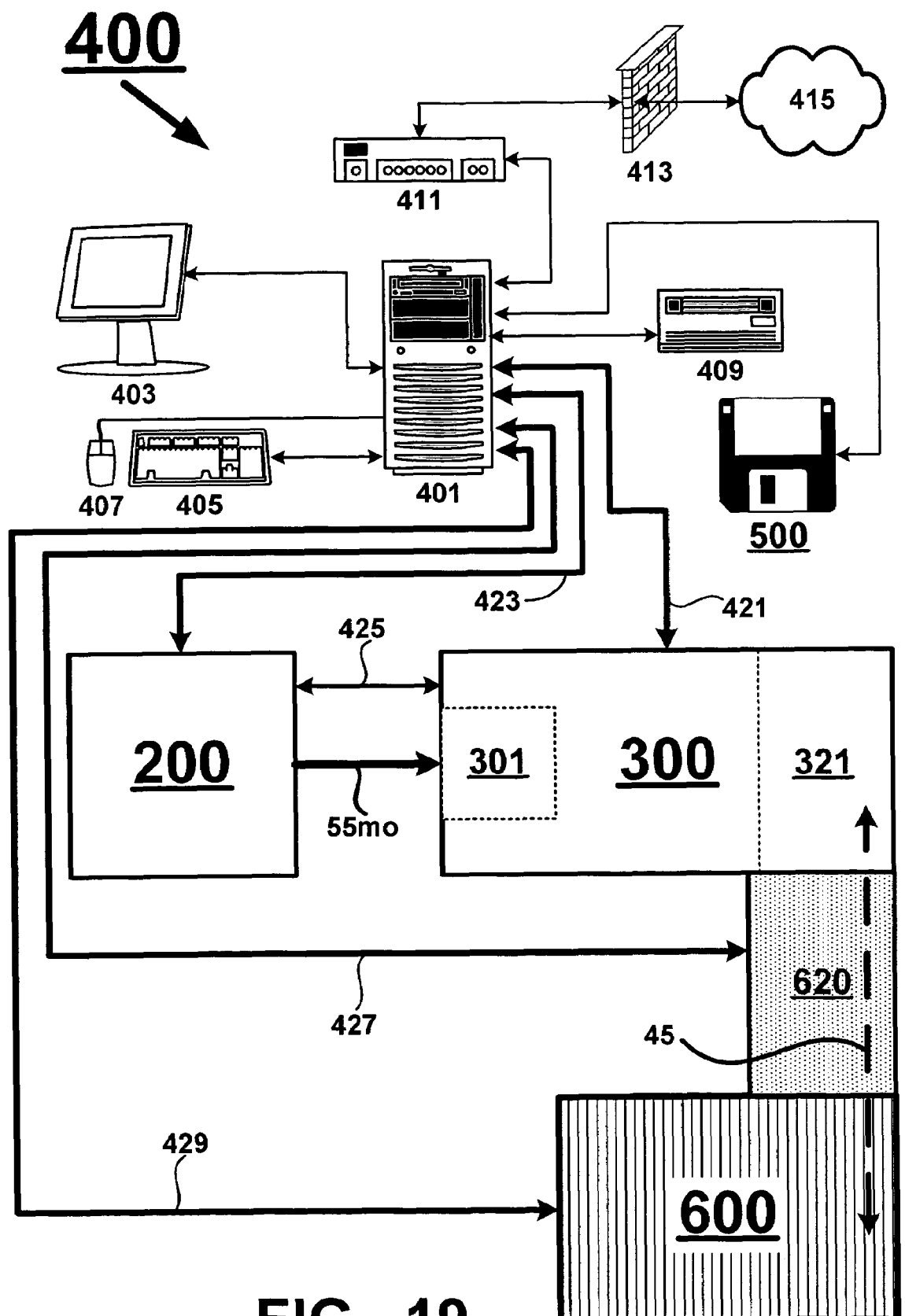
FIG. 19 is a diagram depicting a system for fabricating a polarizing layer using a gas cluster ion beam apparatus and a metal-organic gas generator.

In FIG. 19, a system 400 for depositing a polarizing material using the GCIB 300 includes a metal-organic generator 200 that is connected with the GCIB 300. The metal-organic generator 200 generates a metal-organic gas $55mo$ that includes at least one metal-organic compound $60m$. The metal-organic generator 200 can include one or more generators as was described above in reference to FIGS. 5 and 17. The metal-organic gas $55mo$ is supplied to the gas source chamber 301 of the GCIB 300. As was described above, the metal-organic gas 55*mo* can be mixed with a carrier gas 59 to form a composite gas 61*c* that is used to form the beam 60 of gas cluster ions 309 in the GCIB 300.

The system 400 can also include a controller 401 for controlling the GCIB 300 and the metal-organic generator 200. The controller 401 can be a general purpose computer, a work station, a server, a laptop PC, or a dedicated process controller, for example. A commercially available GCIB apparatus 300 may already include a controller 401 that can be used to control the GCIB 300 and the metal-organic generator 200. If necessary, the system 400 may also include input devices such as a keyboard 405, a mouse 407, a display 403, and one or more peripheral devices 409 that are connected with the controller 401. Additionally, the system 400 can include a networking device 411 (e.g. a LAN device) that can be hardwired or wirelessly connected with the controller 401. The networking device 411 may also allow the controller to communicate with an internal network (e.g. an Intranet) or to communicate with an external network such as the Internet 415. A firewall 413 may also be used to provide secure communications between the controller 401 and the Internet 415. The controller 401 can communicate with and control the GCIB 300 and the metal-organic generator 200 via control signals 421 and 423 respectively. The GCIB 300 and the metal-organic generator 200 may also include a communications link 425 that allows data and control signals to be communicated between them. The keyboard 405, mouse 407, and the display 407 can be used to monitor, stop, start, or modify the processing of the interfaces surfaces (11*s*, 13*s*) by the system 400.

Control of the GCIB 300 and the metal-organic generator 200 by the controller 401 can be by a computer program or an algorithm fixed in a computer readable media 500. The computer readable media 500 can include data and instructions that implement the method 100 of FIG. 1. Although the computer readable media 500 is depicted as a floppy disc, the computer readable media 500 can be any media in which program instructions and data can be fixed and includes but is not limited to optical storage media, magnetic storage media, and solid state memory media. The solid state memory media includes but is not limited to MRAM, SRAM, DRAM, ROM, and flash memory, just to name a few. The computer readable media 500 may be contained within the controller 401 or may be communicated to the controller 401 via a peripheral device 409, the Internet 415, or an local network such as an Intranet. For example, a hard drive in the controller 401 can be the media 500 or an optical disk drive 409 can include an optical disk as the media 500. A suitable programming language including but not limited to C, C++, and JAVA™ can be used to program the instructions that are fixed in the media 500.

The system 400 can also include at least one processing unit 600 that can be connected with the GCIB 300. For instance, the load lock 620 may be used to connect the processing unit 600 with the GCIB 300. Signals (421, 423, 425, 427, 429) from the controller 401 can be used to control and coordinate processing between the GCIB 300, the metal-organic generator 200, the processing unit 600, and the load lock 620. The load lock 620 can be used to transport a work piece (e.g. the layers 11 and 13) back and forth between the GCIB 300 and the processing unit 600.

As one example, the processing unit 600 can be a deposition apparatus for depositing one or more layers of material as was described above. The layer of material to be deposited can be the tunnel barrier layer 13. After the deposition, the tunnel barrier layer 13 can be moved from the processing unit 600 to the GCIB 300 via the load lock 620 so that the interface surface 13*s* of the tunnel barrier layer 13 can be irradiated to form the second polarizing layer 22. The magnetoresistance device 10 can then be moved back to the processing unit 600 for a deposition of new layer of material on the second polarizing layer 22. After a deposition of the new layer of material in the processing unit 600, the interface surface of the new layer can optionally be moved to the GCIB 300 so that the interface layer of the new layer can be processed by the GCIB 300. The processing of the new layer need not be to form the polarizing layers (20, 22). Instead, the GCIB 300 can be used to perform some other process such as surface smoothing or surface doping on the new layer, for example Although several embodiments of the present invention have been disclosed and illustrated, the invention is not limited to the specific forms or arrangements of parts so described and illustrated. The invention is only limited by the claims.

What is claimed is:

1. A method of fabricating a polarizing layer using a gas cluster ion beam apparatus, comprising:
    generating a metal-organic gas including a metal-organic compound, the metal-organic compound including a polarizing material;
    forming a composite gas by combining the metal-organic gas with a carrier gas;
    processing the composite gas in the gas cluster ion beam apparatus to form a beam of gas cluster ions; and
    forming a first polarizing layer on an interface surface by irradiating the interface surface with the beam so that the polarizing material is deposited on the interface surface.

2. The method as set forth in claim 1, wherein the processing comprises:
    forming a beam comprising a plurality of gas clusters from the composite gas;
    ionizing the gas clusters to form the beam of gas cluster ions; and
    accelerating the gas cluster ions.

3. The method as set forth in claim 1, wherein the polarizing material comprises an element selected from the group consisting of iron, cobalt, and cobalt and iron.

4. The method as set forth in claim 1 and further comprising after the forming of the first polarizing layer:
    depositing a tunnel barrier layer on the first polarizing layer.

5. The method as set forth in claim 1, wherein a momentum of the gas cluster ions is increased by increasing an acceleration voltage of the gas cluster ion beam apparatus during the accelerating.

6. The method as set forth in claim 1, wherein at least a portion of the polarizing material is positioned inward of the interface surface by a predetermined depth.

7. The method as set forth in claim 6, wherein the predetermined depth is in a range from about 0.5 monolayers to about 2.0 monolayers.

8. The method as set forth in claim 1 and further comprising:
    selecting a plurality of different metal-organic compounds from a plurality of metal-organic generators so that the selected metal-organic compounds are included in the metal-organic gas during the generating.

9. The method as set forth in claim 1 and further comprising:
    modulating a concentration of the polarizing material in contact with the interface surface and the modulating comprises a selected one of an increasing a concentration of the metal-organic compound in the metal-organic gas or a decreasing of the concentration of the metal-organic compound in the metal-organic gas.

10. The method as set forth in claim 1 and further comprising:
continuing the depositing until a desired concentration of the polarizing material is in contact with the interface surface.

11. The method as set forth in claim 1, wherein a contact of the polarizing material with the interface surface results in a chemical reaction between the polarizing material and the interface surface.

12. The method as set forth in claim 1 and further comprising during the forming of the first polarizing layer:
generating a relative motion between the beam the interface surface.

13. The method as set forth in claim 1, wherein the generating the metal-organic gas comprises heating the metal-organic compound so that the metal-organic compound dissociates.

14. The method as set forth in claim 1 and further comprising:
smoothing the interface surface to reduce a surface roughness of the interface surface, the smoothing occurring at a selected one of
prior to the forming of the first polarizing layer, or
during the forming of the first polarizing layer.

15. The method as set forth in claim 1, wherein the interface surface is connected with a layer of material selected from the group consisting of a precursor layer and a tunnel barrier layer.

16. The method as set forth in claim 15, wherein the precursor layer is a ferromagnetic layer selected from the group consisting of data layer and a reference layer.

17. The method as set forth in claim 1, wherein the first polarizing layer has a thickness in a range from about 1.0 monolayer to about 5.0 monolayers.

18. The method as set forth in claim 1 and further comprising:
continuing the forming of the first polarizing layer until a desired thickness of the polarizing material is in contact with the interface surface.

19. A magnetoresistance device including a first polarizing layer fabricated according to the method as set forth in claim 1.

20. The method as set forth in claim 1 and further comprising:
forming a second polarizing layer on an interface surface of a tunnel barrier layer by irradiating the interface surface of the tunnel barrier layer with the beam so that the polarizing material is deposited on the interface surface of the tunnel barrier layer.

21. The method as set forth in claim 20, wherein the polarizing material comprises an element selected from the group consisting of iron, cobalt, and cobalt and iron.

22. The method as set forth in claim 20, wherein the second polarizing layer has a thickness in a range from about 1.0 monolayer to about 5.0 monolayers.

23. The method as set forth in claim 20 and further comprising:
smoothing the interface surface to of the tunnel barrier layer to reduce a surface roughness of the interface surface, the smoothing occurring at a selected one of
prior to the forming of the second polarizing layer, or
during the forming of the second polarizing layer.

24. The method as set forth in claim 20, wherein at least a portion of the polarizing material is positioned inward of the interface surface by a predetermined depth.

25. The method as set forth in claim 24, wherein the predetermined depth is in a range from about 0.5 monolayers to about 2.0 monolayers.

26. A magnetoresistance device including a first polarizing layer and a second polarizing layer fabricated according to the method as set forth in claim 20.

27. A computer readable media including program instructions for fabricating a polarizing layer using a gas cluster ion beam apparatus, comprising:
a program instruction for generating a metal-organic gas including a metal-organic compound, the metal-organic compound including a polarizing material;
a program instruction for forming a composite gas by combining the metal-organic gas with a carrier gas;
a program instruction for processing the composite gas in the gas cluster ion beam apparatus to form a beam of gas cluster ions; and
a program instruction for forming a first polarizing layer on an interface surface by irradiating the interface surface with the beam so that the polarizing material is deposited on the interface surface.

28. The computer readable media as set forth in claim 27, wherein the program instruction for the processing comprises:
a program instruction for forming a beam comprising a plurality of gas clusters from the composite gas;
a program instruction for ionizing the gas clusters to form the gas cluster ions; and
a program instruction for accelerating the gas cluster ions.

29. The computer readable media as set forth in claim 27 and further comprising:
a program instruction for generating a relative motion between the beam and the interface surface.

30. The computer readable media as set forth in claim 27 and further comprising:
a program instruction for smoothing the interface surface at a selected one of prior to the forming of the first polarizing layer or during the forming of the first polarizing layer.

31. The computer readable media as set forth in claim 27 and further comprising:
a program instruction for forming a second polarizing layer on an interface surface of a tunnel barrier layer by irradiating the interface surface with the beam so that the polarizing material is deposited on the interface surface of the tunnel barrier layer.

32. The computer readable media as set forth in claim 31 and further comprising:
a program instruction for smoothing the interface surface of the tunnel barrier layer at a selected one of prior to the forming of the second polarizing layer or during the forming of the second polarizing layer.

33. A system for fabricating a polarizing layer using a gas cluster ion beam apparatus, comprising:
a metal-organic generator operative to generate a metal-organic gas including at least one metal-organic compound, the metal-organic compound including a polarizing material, the metal-organic generator is connected with the gas cluster ion beam apparatus so that the metal-organic gas is supplied to the gas cluster ion beam apparatus; and
a controller for controlling the metal-organic generator and the gas cluster ion beam apparatus, and wherein the gas cluster ion beam apparatus is operative to form a polarizing layer on an interface surface by irradiation the interface surface with a beam of gas cluster ions so that the polarizing material is deposited on the interface surface.

34. The system as set forth in claim 33 and further comprising:

a processing unit connected with the gas cluster ion beam apparatus and operative to perform a process on a work piece.

35. The system as set forth in claim 34 and further comprising:

a load lock connected with the gas cluster ion beam apparatus and the processing unit, the load lock is operative to transport the work piece between the gas cluster ion beam apparatus and the processing unit.

\* \* \* \* \*